(12) United States Patent
Kim et al.

(10) Patent No.: US 10,515,881 B2
(45) Date of Patent: Dec. 24, 2019

(54) SUBSTRATE, ELECTRONIC DEVICE AND DISPLAY DEVICE HAVING THE SAME

(71) Applicant: Samsung Display Co., Ltd., Yongin-si, Gyeonggi-do (KR)

(72) Inventors: Byoung Yong Kim, Yongin-si (KR); Jong Hyuk Lee, Yongin-si (KR); Jeong Ho Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/827,382

(22) Filed: Nov. 30, 2017

(65) Prior Publication Data
US 2018/0174952 A1 Jun. 21, 2018

(30) Foreign Application Priority Data
Dec. 16, 2016 (KR) .................. 10-2016-0172753

(51) Int. Cl.
*H01L 23/498* (2006.01)
*H01L 23/00* (2006.01)
(Continued)

(52) U.S. Cl.
CPC ........ *H01L 23/49811* (2013.01); *H01L 24/13* (2013.01); *H01L 24/16* (2013.01); *H01L 27/3276* (2013.01); *H05K 1/028* (2013.01); *H05K 1/111* (2013.01); *H05K 3/244* (2013.01); *H05K 5/0017* (2013.01); *H01L 23/4985* (2013.01); *H01L 23/49866* (2013.01);
(Continued)

(58) Field of Classification Search
CPC ......... H01L 23/49811; H01L 23/49866; H01L 24/13; H01L 24/16; H01L 27/3276; H01L 27/3246; H01L 27/3248; H01L 51/5256; H01L 2224/13111; H01L 2224/13124; H01L 2224/13144; H01L 2224/13147; H01L 2224/1318; H01L 2224/16227; H05K 1/028; H05K 1/111; H05K 3/244; H05K 5/0017; H05K 2201/0338; H05K 2203/0285; Y02P 70/611
USPC ........................................................ 361/767
See application file for complete search history.

(56) References Cited

U.S. PATENT DOCUMENTS

| 5,171,711 A | 12/1992 | Tobimatsu |
| 2005/0215045 A1 | 9/2005 | Rinne et al. |

(Continued)

OTHER PUBLICATIONS

Balle, Frank et al., "Ultrasonic Metal Welding of Aluminum Sheets to Carbon Fibre Reinforced Thermoplastic Composites," Advanced Engineering Materials, http://www.aem-journal.com, vol. 11, No. 1-2, 2009, pp. 35-39.

(Continued)

*Primary Examiner* — Michael P McFadden
(74) *Attorney, Agent, or Firm* — Lewis Roca Rothgerber Christie LLP

(57) ABSTRACT

A substrate includes a base substrate, and a pad at one side of the base substrate, wherein the pad comprises: a first conductive pattern on the base substrate, an insulating layer including a plurality of contact holes exposing a portion of the first conductive pattern, and second conductive patterns separately on the insulating layer and connected to the first conductive pattern through the plurality of contact holes, wherein side surfaces of the second conductive patterns are exposed.

39 Claims, 14 Drawing Sheets

(51) Int. Cl.
  *H05K 1/02* (2006.01)
  *H05K 5/00* (2006.01)
  *H05K 1/11* (2006.01)
  *H05K 3/24* (2006.01)
  *H01L 27/32* (2006.01)
  *H01L 51/52* (2006.01)

(52) U.S. Cl.
  CPC ...... *H01L 27/3246* (2013.01); *H01L 27/3248* (2013.01); *H01L 51/5256* (2013.01); *H01L 2224/1318* (2013.01); *H01L 2224/13111* (2013.01); *H01L 2224/13124* (2013.01); *H01L 2224/13144* (2013.01); *H01L 2224/13147* (2013.01); *H01L 2224/16227* (2013.01); *H05K 2201/0338* (2013.01); *H05K 2203/0285* (2013.01); *Y02P 70/611* (2015.11)

(56) References Cited

U.S. PATENT DOCUMENTS

| | | | |
|---|---|---|---|
| 2006/0055037 A1* | 3/2006 | Park | H01L 24/11 257/737 |
| 2008/0180376 A1 | 7/2008 | Kim et al. | |
| 2014/0048837 A1 | 2/2014 | Choi et al. | |
| 2014/0130657 A1 | 5/2014 | Pilpel et al. | |
| 2015/0366728 A1 | 12/2015 | Febo et al. | |
| 2016/0165718 A1 | 6/2016 | Oh | |
| 2016/0306213 A1 | 10/2016 | Lee | |
| 2017/0213904 A1* | 7/2017 | Na | H01L 29/7787 |

OTHER PUBLICATIONS

EPO Extended Search Report dated May 11, 2018, for corresponding European Patent Application No. 17207911.3 (9 pages).

\* cited by examiner

SUBSTRATE, ELECTRONIC DEVICE AND DISPLAY DEVICE HAVING THE SAME

CROSS-REFERENCE TO RELATED APPLICATION

This application claims priority to and the benefit of Korean Patent Application No. 10-2016-0172753, filed on Dec. 16, 2016, in the Korean Intellectual Property Office, the entire content of which is incorporated herein by reference.

BACKGROUND

1. Field

Aspects of example embodiments of the present disclosure relate to a substrate, an electronic device, and a display device having the same.

2. Description of the Related Art

Recently, high performance and high integration of electronic devices, such as semiconductor devices and display panels, have resulted in a significant increase in number of connection terminals provided in these electronic devices. Therefore, the connection terminals are being reduced in size, and the distance between neighboring connection terminals is also being reduced.

An electronic device may be electrically connected to another electronic device by using an adhesive such as an anisotropic conductive film (ACF). However, when the electronic devices are connected using the ACF, a short-circuit failure may occur between the connection terminals or an open-circuit failure may occur between the electronic devices. For example, conductive particles included in the ACF may be concentrated around side surfaces of neighboring connection terminals, such as bumps, and a short-circuit failure may occur between the neighboring bumps. An open-circuit failure may occur between the electronic devices since the conductive particles in the ACF do not contact the bumps having a fine size.

SUMMARY

Aspects of example embodiments of the present disclosure relate to a substrate capable of preventing a short-circuit failure or an open-circuit failure caused by conductive particles of an anisotropic conductive film (or capable of reducing a likelihood or degree of such failures), an electronic device, and a display device having the same.

According to some example embodiments of the present disclosure, a substrate may include a base substrate, and a pad provided at one side of the base substrate, wherein the pad comprises: a first conductive pattern provided on the base substrate, an insulating layer including a plurality of contact holes exposing a portion of the first conductive pattern, and second conductive patterns separately provided on the insulating layer and connected to the first conductive pattern through the plurality of contact holes, wherein side surfaces of the second conductive patterns are exposed.

The second conductive patterns may include a first conductive layer and a second conductive layer stacked sequentially, and a side surface of the first conductive layer may be exposed.

The second conductive layer may include a material more rigid than a material included in the first conductive layer.

The first conductive layer may include at least one selected from gold (Au), aluminum (Al), copper (Cu), tin (Sn), and molybdenum (Mo).

The second conductive layer may include at least one selected from titanium (Ti), molybdenum (Mo), tin (Sn), nickel (Ni), and a conductive oxide.

The conductive oxide may include at least one selected from indium tin oxide (ITO), indium zinc oxide (IZO), antimony zinc oxide (AZO), indium tin zinc oxide (ITZO), zinc oxide (ZnO), and tin oxide (SnO2).

The substrate may further include a third conductive layer provided between the first conductive layer and the first conductive pattern.

The third conductive layer may include at least one selected from titanium (Ti), molybdenum (Mo), tin (Sn), nickel (Ni), and a conductive oxide. The third conductive layer may include the same (e.g., substantially the same) material as the second conductive layer.

According to some embodiments, an electronic device may include a substrate including a base substrate and a pad provided on the base substrate, and an electronic device including a bump connected to the pad, wherein the pad comprises: a first conductive pattern provided on the base substrate, an insulating layer including a plurality of contact holes exposing a portion of the first conductive pattern, and second conductive patterns separately provided on the insulating layer and connected to the first conductive pattern through the plurality of contact holes, wherein at least a portion of the second conductive patterns are connected to the bump, and side surfaces of remaining second conductive patterns are exposed.

The second conductive patterns connected to the bump may include a first conductive layer. The electronic device may further include a mixed conductive layer provided between the first conductive layer and the bump and including a mixture of a first conductive layer material and a bump material.

The remaining second conductive patterns may include the first conductive layer and a second conductive layer provided on the first conductive layer, and a side surface of the first conductive layer may be exposed.

The mixed conductive layer may include fragments including a second conductive layer material.

The electronic device may further include a non-conductive film filling a different region from a region where the bump and the pad are connected.

The non-conductive film may include a heat-flowable polymeric material.

According to some embodiments, an electronic device may include a substrate including a base substrate and a pad provided on the base substrate, and an electronic device including a bump connected to the pad, wherein the pad comprises: a first conductive pattern provided on the base substrate, an insulating layer including a plurality of contact holes exposing a portion of the first conductive pattern, second conductive patterns separately provided on the insulating layer and including a first conductive layer connected to the first conductive pattern through the plurality of contact holes, and a mixed conductive layer provided between the second conductive patterns and the bump, wherein the mixed conductive layer includes a mixture of a first conductive layer material and a bump material.

According to some embodiments, a display device may include a display panel including a display area and a non-display area, wherein the display panel includes a first pad unit including a plurality of first pads and a second pad unit including a plurality of second pads provided in the non-display area, a first driver including a plurality of first bumps connected to the first pads, a flexible printed circuit board including a plurality of second bumps connected to the second pad units, and a second driver connected to one end of the flexible printed circuit board, wherein one selected from the flexible printed circuit board and the second driver includes third bumps and the other includes third pads connected to the third bumps, and wherein each of the first pads, the second pads and the third pads comprises: a first conductive pattern, an insulating layer including a plurality of contact holes exposing a portion of the first conductive pattern, and second conductive patterns separately provided on the insulating layer and connected to the first conductive pattern through the plurality of contact holes, wherein at least a portion of the second conductive patterns are connected to one selected from the first to third bumps, and side surfaces of remaining second conductive patterns are exposed.

BRIEF DESCRIPTION OF THE DRAWINGS

Aspects of some example embodiments are described hereinafter with reference to the accompanying drawings. The present system and method, however, should not be construed as being limited to these embodiments. Rather, these embodiments are provided to facilitate the understanding by those of ordinary skill in the art.

In the drawings, the dimensions of the figures may be exaggerated for clarity. It is understood that when an element is referred to as being "between" two elements, it may be the only element between the two elements, or one or more intervening elements may also be present, unless otherwise indicated. Like reference numerals refer to like elements throughout.

DETAILED DESCRIPTION

Figure 1:
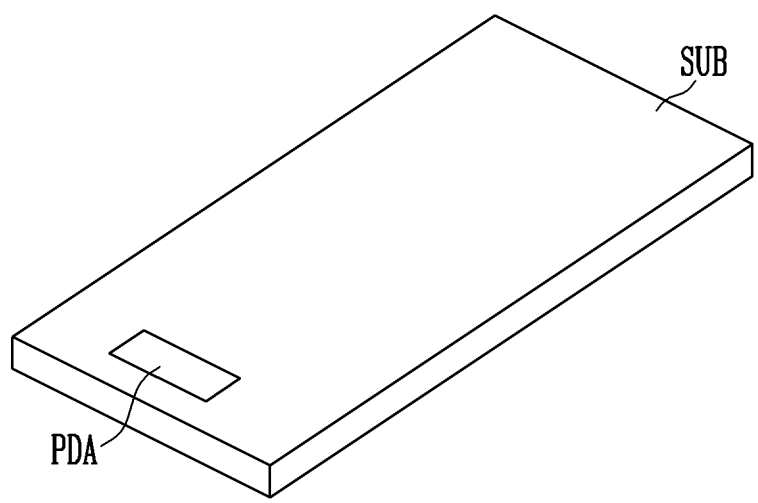
FIG. 1 is a perspective view illustrating a substrate according to an embodiment of the present disclosure.

While aspects of some example embodiments of the present disclosure are described with reference to the accompanying drawings, it is to be understood that various changes and modifications may be made in the present disclosure without departing from the spirit and scope thereof. Further, it should be understood that the present disclosure is not limited to the embodiments disclosed herein, and various changes, equivalences and substitutions may be made without departing from the scope and spirit of the present disclosure.

Like reference numerals designate like elements throughout the drawings. In the drawings, the dimension of elements may be exaggerated for the clarity of this disclosure. Although terms "first", "second", etc. are used herein to describe various elements, these elements should not be limited by these terms. These terms are only used to distinguish one element from another element. For example, the first element may be designated as the second element without departing from the scope of the present disclosure. Similarly, the second element may be designated as the first element. Further, the singular forms "a" and "an" include plural referents unless the context clearly dictates otherwise.

Herein, it should be understood that terms "include" or "have" are inclusive of characteristics, numerals, steps, operations, elements, parts or combination thereof, but are not exclusive of one or more different characteristics, numerals, steps, operations, elements, parts or combination thereof. Further, when an element, such as a layer, a film, a region or a plate, is referred to as being "on" another element, it can be directly on the another element or be on the another element with one or more intervening elements interposed therebetween. Also, when an element, such as a layer, a film, a region or a plate, is referred to as being "under" another element, it can be right under the other element or be under the other element with one or more intervening elements interposed therebetween. In this disclosure, the term "substantially" includes the meanings of completely, almost completely or to any significant degree in some instances and in accordance with those skilled in the art. Moreover, "formed on" can also mean "formed over."

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of" when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Hereinafter, aspects of some example embodiments will be described in more detail with reference to the accompanying drawings.

Figure 2:
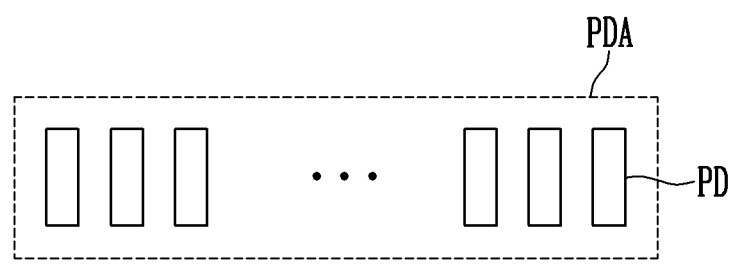
FIG. 2 is an enlarged view of a pad unit shown in FIG. 1.
Figure 3:
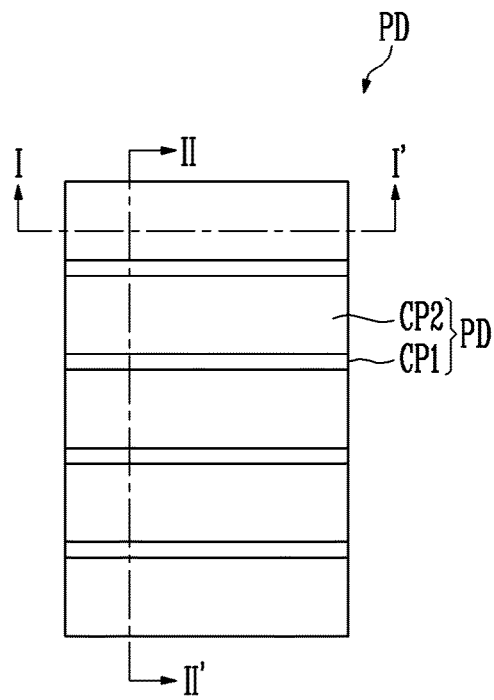
FIG. 3 is a plan view illustrating one of the pads shown in FIG. 2.
Figure 4:
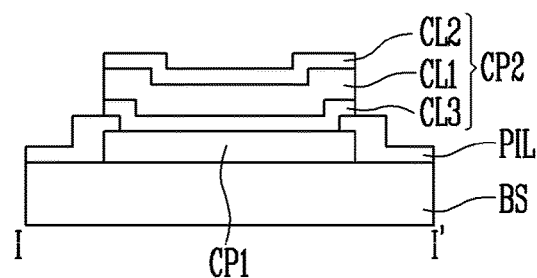
FIG. 4 is a cross-sectional diagram taken along the line I-I' of FIG. 3.
Figure 5:
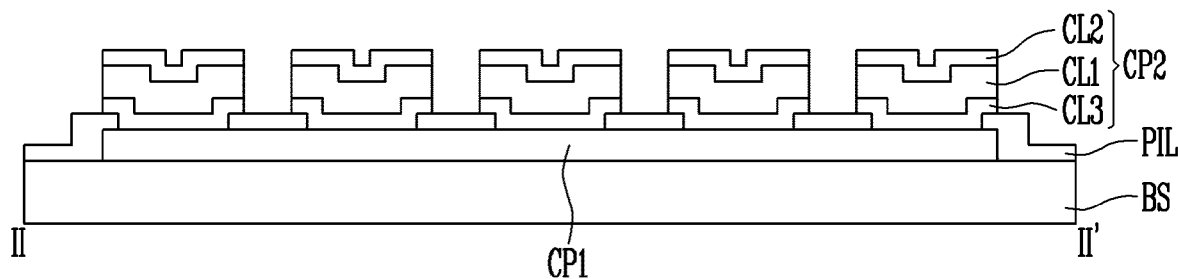
FIG. 5 is a cross-sectional diagram taken along the line II-II' of FIG. 3.

FIG. 1 is a perspective view illustrating a substrate according to an embodiment of the present disclosure. FIG. 2 is an enlarged view of a pad unit shown in FIG. 1. FIG. 3 is a plan view illustrating one of the pads shown in FIG. 2. FIG. 4 is a cross-sectional diagram taken along the line I-I' of FIG. 3. FIG. 5 is a cross-sectional diagram taken along the line II-II' of FIG. 3.

Referring to FIGS. 1-5, a substrate SUB may include a base substrate BS and a pad unit PDA provided on at least one side of the base substrate BS.

The base substrate BS may be, but is not limited to, one selected from a semiconductor substrate, a flexible printed circuit board, a printed circuit board, and an array substrate of a display panel. In addition, the semiconductor substrate may be a semiconductor wafer. However, the semiconductor substrate is not limited thereto. The material and shape of the semiconductor substrate may be changed. According to an embodiment, a circuit layer on which various suitable circuit devices and/or metal lines are disposed may be embedded in the semiconductor substrate.

The pad unit PDA may be disposed on at least one surface of the base substrate BS. The pad unit PDA may include a plurality of pads PD. The pads PD may be provided to electrically connect the substrate SUB to another electronic device. The pad PD may be a kind of input/output terminal.

Each of the pads PD may include a first conductive pattern CP1 provided on the base substrate BS, a pad insulating layer PIL having a plurality of contact holes exposing a portion of the first conductive pattern CP1, and second conductive patterns CP2 provided on the pad insulating layer PIL.

The first conductive pattern CP1 may include one selected from a conductive metal, a conductive organic material, and a conductive oxide. For example, the first conductive pattern CP1 may include at least one selected from copper (Cu), silver (Ag), gold (Au), platinum (Pt), palladium (Pd), nickel (Ni), tin (Sn), aluminum (Al), cobalt (Rh), rhodium (Rh), iridium (Ir), iron (Fe), ruthenium (Ru), osmium (Os), molybdenum (Mo), tungsten (W), niobium (Nb), tantalum (Ta), titanium (Ti), bismuth (Bi), antimony (Sb), and lead (Pb). In addition, the first conductive pattern CP1 may include at least one selected from a polythiophene-based compound, a polypyrrole-based compound, a polyaniline-based compound, a polyacetylene-based compound, a polyphenylene-based compound, and a mixture thereof. In addition, the first conductive pattern CP1 may include at least one selected from indium tin oxide (ITO), indium zinc oxide (IZO), antimony zinc oxide (AZO), indium tin zinc oxide (ITZO), zinc oxide (ZnO), and tin oxide (SnO2). It is described above that the first conductive pattern CP1 includes at least one selected from a conductive metal, a conductive organic material, and a conductive oxide. However, the present disclosure is not limited thereto. The first conductive pattern CP1 may include a conductive material in addition to the conductive metal, the conductive organic material, and/or the conductive oxide.

The pad insulating layer PIL may include at least one selected from an organic insulating layer and an inorganic insulating layer. The organic insulating layer may include an organic insulating material transmitting light (e.g., a light transmissive organic insulating material). For example, the organic insulating layer may include at least one selected from polyacrylates resin, epoxy resin, phenolic resin, polyamides resin, polyimides rein, unsaturated polyesters resin, poly-phenylene ethers resin, poly-phenylene sulfides resin, and benzocyclobutenes resin. The inorganic insulating layer may include at least one selected from silicon oxide (SiOx, where 1≤x≤2) and silicon nitride (SiNx, 1≤x≤1.33). For example, the inorganic insulating layer may include a first layer including silicon oxide and a second layer disposed on the first layer and including silicon nitride.

The contact holes in the pad insulating layer PIL may expose the first conductive pattern CP1. The contact holes may be separated from each other in a length direction or a width direction of the first conductive pattern CP1.

The second conductive patterns CP2 may be provided on the pad insulating layer PIL and separated from each other in the length direction or the width direction of the first conductive pattern CP1. Each of the second conductive patterns CP2 may be electrically connected to the first conductive pattern CP1 through each of the contact holes.

The second conductive patterns CP2 may include a first conductive layer CL1 provided on the pad insulating layer PIL and a second conductive layer CL2 provided on the first conductive layer CL1.

The first conductive layer CL1 may have conductivity and include a flexible material. For example, the first conductive layer CL1 may include at least one selected from gold (Au), aluminum (Al), copper (Cu), tin (Sn), and molybdenum (Mo). In addition, since neighboring second conductive patterns CP2 are separated from each other, side surfaces of the first conductive layer CL1 may be exposed to the outside.

The second conductive layer CL2 may have conductivity and include a material more rigid than the material included in the first conductive layer CL1 (hereinafter, referred to as a "first conductive layer material"). In addition, the melting temperature of the material included in the second conductive layer CL2 (hereinafter, referred to as a "second conductive layer material") may be higher than the melting temperature of the first conductive layer material. For example, the second conductive layer CL2 may include at least one selected from titanium (Ti), molybdenum (Mo), tin (Sn), nickel (Ni), and a conductive oxide.

The second conductive layer CL2 may have a smaller thickness than the first conductive layer CL1. For example, the second conductive layer CL2 may have a thickness of 10 nm to 100 nm.

The second conductive patterns CP2 may further include a third conductive layer CL3 provided under the first conductive layer CL1. The third conductive layer CL3 may be provided between the pad insulating layer PIL and the first conductive layer CL1 and between the first conductive pattern CP1 and the first conductive layer CL1.

The third conductive layer CL3 may include a material more rigid than the first conductive layer material. For example, the third conductive layer CL3 may include at least one selected from titanium (Ti), molybdenum (Mo), tin (Sn), nickel (Ni) and a conductive oxide. In addition, the third conductive layer CL3 may include the same (e.g., substantially the same) material as the second conductive layer CL2.

Figure 6:
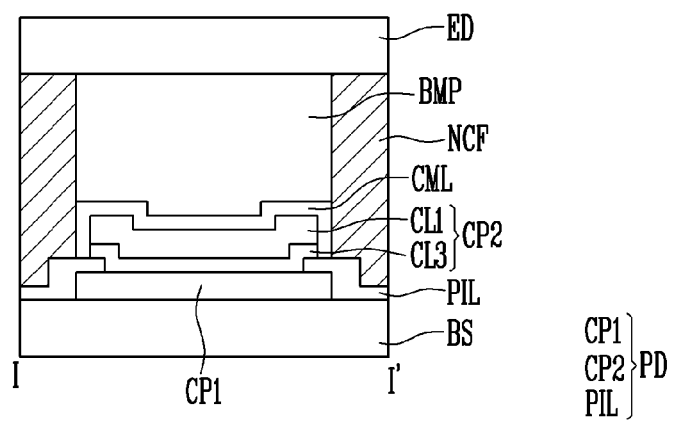
FIGS. 6-7 are cross-sectional diagrams illustrating a substrate shown in FIGS. 1-5 electrically connected to an electronic device.
Figure 7:
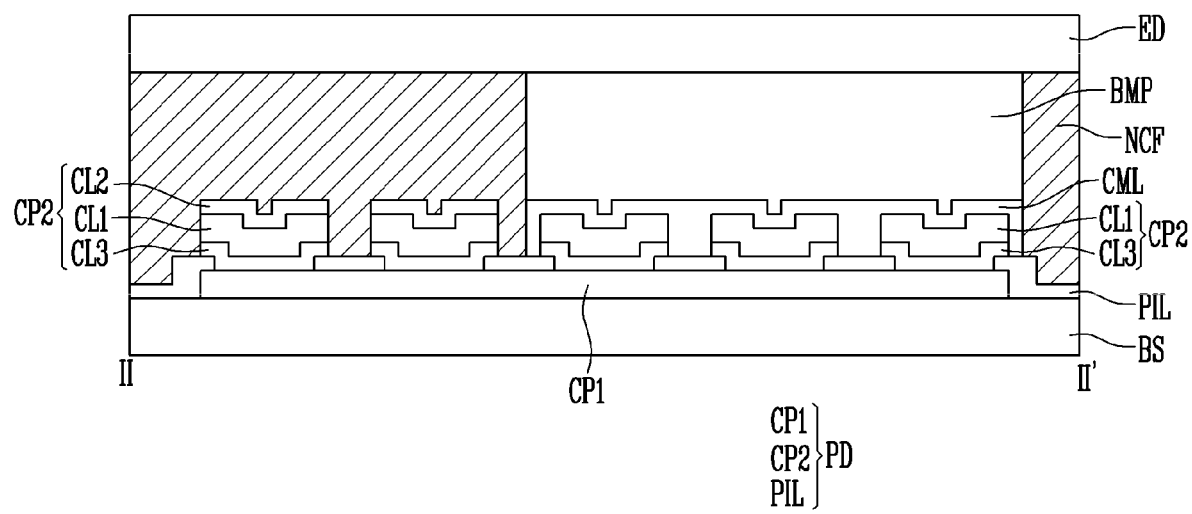
Figure 8:
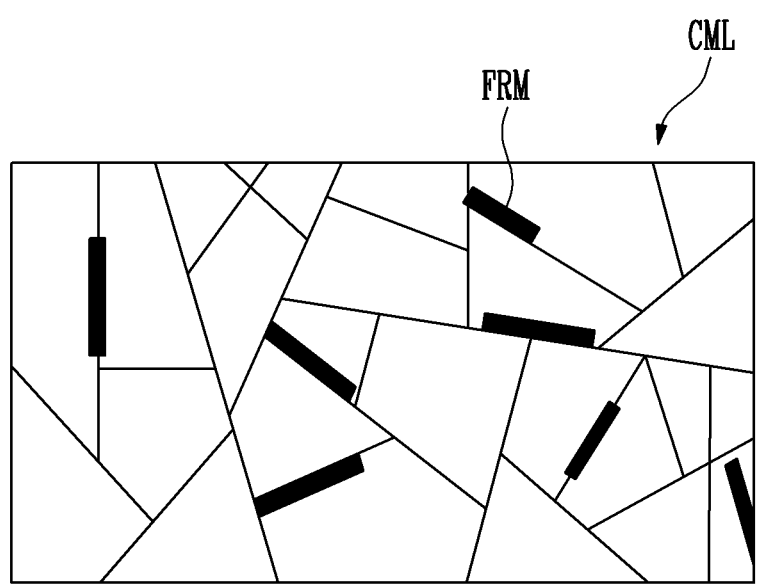
FIG. 8 is a conceptual view illustrating a mixed conductive layer shown in FIGS. 6-7.

FIGS. 6-7 are cross-sectional diagrams illustrating the substrate SUB shown in FIGS. 1-5 electrically connected to an electronic device. FIG. 8 is a conceptual view illustrating a mixed conductive layer shown in FIGS. 6-7. FIG. 6 is a cross-sectional diagram of the connection structure in a direction of the line I-I' of FIG. 3. FIG. 7 is a cross-sectional diagram of the connection structure in a direction of the line of FIG. 3.

Referring to FIGS. 1-8, the substrate SUB may include the base substrate BS and the pad unit PDA provided at one side of the base substrate BS and including the plurality of pads PD.

The pads PD may be connected to bumps BMP of an electronic device ED, respectively.

The electronic device ED may vary depending on the substrate SUB. When the substrate SUB is a semiconductor substrate, the electronic device ED may be one selected from an array substrate of a display panel, a flexible printed circuit board, and a printed circuit board. In addition, when the substrate SUB is one selected from the array substrate of the display panel, the flexible printed circuit board, and the printed circuit board, the electronic device ED may be a semiconductor substrate.

The bumps BMP may be input/output terminals for electrical connection between the substrate SUB and the electronic device ED. The bumps BMP may protrude from one surface of the electronic device ED. Surfaces of the bumps BMP, e.g., surfaces of the bumps BMP opposite to the pads PD may be one selected from flat surfaces, concave surfaces, and convex surfaces.

The bumps BMP may have conductivity and include a material more flexible than the second conductive layer material of the pads PD. In addition, the melting temperature of the material included in the bumps BMP (hereinafter, "bump material") may be lower than the melting temperature of the second conductive layer material of the pads PD. For example, the bumps BMP may include at least one selected from gold (Au), aluminum (Al), copper (Cu), tin (Sn), and molybdenum (Mo). In addition, the bumps BMP may include the same (e.g., substantially the same) material as the first conductive layer CL1 of the pads PD. In addition, the bumps BMP may include a different material from the first conductive layer CL1 of the pads PD.

The bumps BMP and the pads PD may be connected by an ultrasonic bonding process. The ultrasonic bonding process may be performed in such a manner that the bumps BMP and the pads PD may be disposed to contact each other and then be connected to each other by applying pressure and ultrasonic waves thereto.

Each of the bumps BMP may be connected to some of the second conductive patterns CP2 of each of the pads PD and may not be connected to the remaining second conductive patterns CP2.

Each of the second conductive patterns CP2 which are not connected to the bump BMP may include the first conductive layer CL1, the second conductive layer CL2 provided on the first conductive layer CL1, and the third conductive layer CL3 provided between the first conductive layer CL1 and the first conductive pattern CP1 and connected to the first conductive pattern CP1.

Each of the second conductive patterns CP2 connected to the bump BMP may include the first conductive layer CL1 and the third conductive layer CL3. In other words, the second conductive patterns CP2 connected to the bump BMP may not include the second conductive layer CL2.

However, a mixed conductive layer CML may be arranged between the bump BMP and the first conductive layer CL1 of the second conductive patterns CP2 coupled to the bump BMP. In addition, the mixed conductive layer CML may fill a region between neighboring second conductive patterns CP2.

In some embodiments, a portion of the bump BMP, for example, the bump BMP may be locally melted by (or melted to) a set or predetermined thickness in a pad PD direction during the ultrasonic bonding process. In addition, during the ultrasonic bonding process, the second conductive layer CL2 of the second conductive patterns CP2 connected to the bump BMP may be fractured, and a portion of the first conductive layer CL1, for example, the first conductive layer CL1 may be locally melted in (or along) the bump BMP direction. The melted bump material and the first conductive layer material may be mixed with each other. The mixture of the bump material and the first conductive layer material may be disposed between the bump BMP and the pad PD and between the neighboring second conductive patterns CP2, and cool down to form the mixed conductive layer CML.

In the mixed conductive layer CML, a mixing ratio of the first conductive layer material and the bump material may not be uniform. In other words, the mixing ratio of the first conductive layer material and the bump material may vary within the mixed conductive layer CML.

In addition, the mixed conductive layer CML may include the second conductive layer material. Since the melting temperature of the second conductive layer material is higher than the melting temperature of the first conductive layer material and the bump material, as shown in FIG. 8, the second conductive layer material in the mixed conductive layer CML may be present as fragments FRM since the melting temperature of the second conductive layer material is higher than the melting temperature of the first conductive layer material and the bump material.

The region between the bumps BMP and the pads PD may be filled with a non-conductive film NCF. The non-conductive film NCF may include a polymeric material which is capable of flowing by heat (e.g., capable of flowing when heated). Therefore, heat may cause the non-conductive film NCF to flow when the heat is applied in conjunction with ultrasonic waves during the ultrasonic bonding of the bumps BMP and the pads PD. When the non-conductive film NCF is moved by the heat, the non-conductive film NCF may fill a different region from the region where the bumps BMP and the pads PD are connected during the ultrasonic bonding process of the bumps BMP and the pads PD. Therefore, the bonding force between the substrate SUB and the electronic device ED may be improved by the non-conductive film NCF.

FIGS. 9-13 are cross-sectional diagrams illustrating processes of connecting the substrate SUB and the electronic device ED as shown in FIGS. 1-8.

Figure 9:
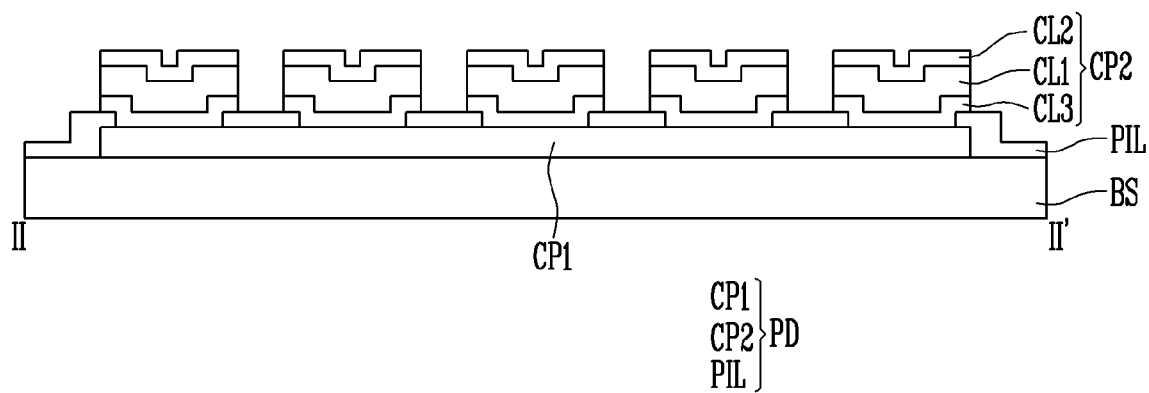
FIGS. 9-13 are cross-sectional diagrams illustrating processes for connecting a substrate and an electronic device shown in FIGS. 1-8.

Referring to FIG. 9, first, the substrate SUB including the base substrate BS, and the pad PD provided on the base substrate BS may be prepared.

The base substrate BS may be one selected from a semiconductor substrate, a flexible printed circuit board, a printed circuit board, and an array substrate of a display panel.

The pad PD may include the first conductive pattern CP1 provided on the base substrate BS, the pad insulating layer PIL having a plurality of contact holes exposing a portion of the first conductive pattern CP1 and the second conductive patterns CP2 provided on the pad insulating layer PIL.

The first conductive pattern CP1 may include a conductive material.

The pad insulating layer PIL may be provided on the first conductive pattern CP1, which may be exposed through the contact holes in the pad insulating layer PIL.

The second conductive patterns CP2 may include the first conductive layer CL1 provided on the pad insulating layer PIL, the second conductive layer CL2 provided on the first conductive layer CL1, and the third conductive layer CL3 provided between the first conductive pattern CP1 and the first conductive layer CL1.

The melting temperature of the first conductive layer material may be lower than the melting temperature of the second conductive layer material. In addition, the second conductive layer material may include a material more rigid than the first conductive layer material. The material included in the third conductive layer CL3 may include the same (e.g., substantially the same) material as the second conductive layer material.

Figure 10:
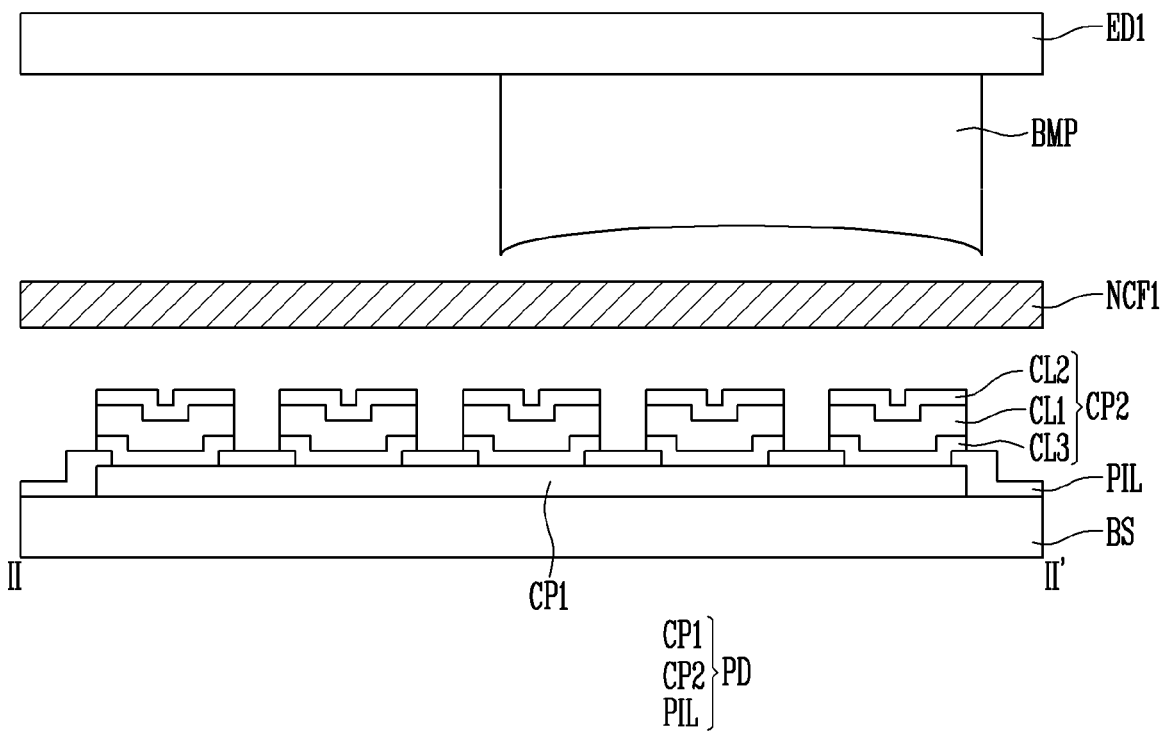

Referring to FIG. 10, after the substrate SUB is prepared, a first non-conductive film NCF1 may be disposed on the substrate SUB. The first non-conductive film NCF1 may include a polymeric material which is capable of flowing by heat.

After the first non-conductive film NCF1 is disposed, a first electronic device ED1 may be arranged over the first non-conductive film NCF1.

The bump BMP may be provided on one surface of the first electronic device ED1, for example, the surface of the first electronic device ED1 opposite to the substrate SUB. The bump BMP may oppose the pad PD. The surface of each bump BMP, e.g., the surface of each bump BMP opposite to each pad PD may be one selected from a flat surface, a concave surface and a convex surface.

The bump BMP may have conductivity and include a flexible material. For example, the bump BMP may include a material more flexible than the second conductive layer material. In addition, the melting temperature of the material included in the bump BMP may be lower than the melting temperature of the second conductive layer material.

In some embodiments, an oxide layer may be provided on the surface of the bump BMP. The oxide layer may be formed by exposure of the bump BMP to air (or any suitable gas including oxygen) and include an oxide of the bump material.

Some of the second conductive patterns CP2 may not be connected to the bump BMP whereby a rework process may be performed when a connection failure occurs between the substrate SUB and the first electronic device ED1.

Figure 11:
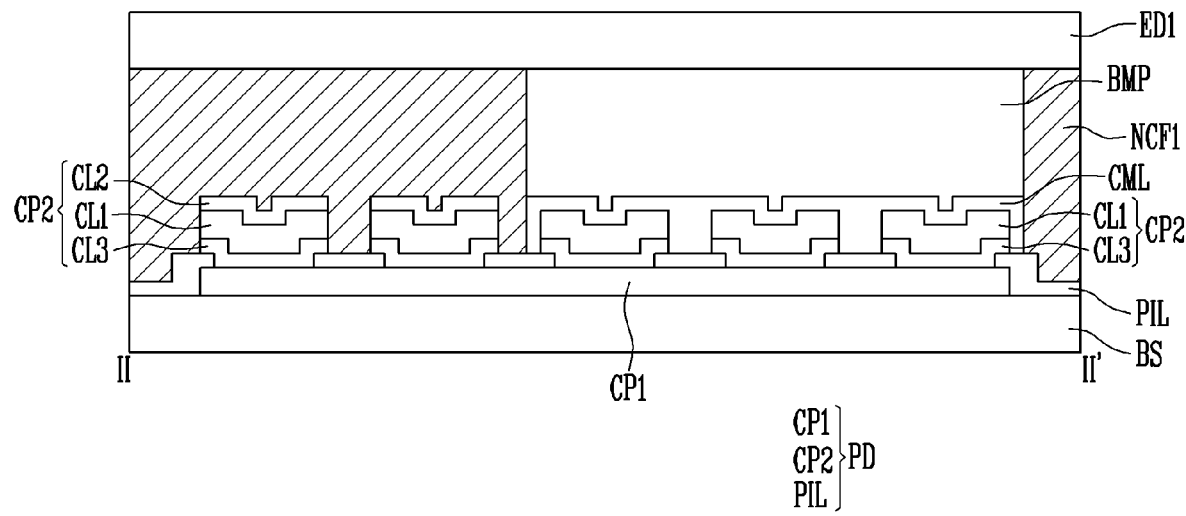

Referring to FIG. 11, after the first electronic device ED1 is arranged on the first non-conductive film NCF1, the bump BMP and the pad PD may be connected by ultrasonic bonding to electrically connect the substrate SUB and the first electronic device ED1. The substrate SUB and the first electronic device ED1 may be electrically connected during the ultrasonic bonding process by supplying heat, pressure and ultrasonic waves.

The bump BMP and the pad PD may be connected to each other by the ultrasonic bonding process as follows.

First, when heat is applied to the first non-conductive film NCF1, the heat may cause the first non-conductive film NCF1 to flow. Subsequently, pressure may be applied to the substrate SUB and the first electronic device ED1 and ultrasonic waves may be supplied to the bump BMP and the pad PD.

When the pressure is applied, the pad PD and the bump BMP may come in direct contact with each other, and the first non-conductive film NCF1 may move to a different region from where the pad PD and the bump BMP contact with each other. In addition, when the ultrasonic waves are supplied, the pad PD and the bump BMP may vibrate. A vibration direction of the pad PD and the bump BMP may be the same (e.g., substantially the same) as the vibration direction of the ultrasonic waves.

When the pad PD and the bump BMP vibrate, friction may occur between the contact area between the pad PD and the bump BMP. The friction may cause fracture in the second conductive layer CL2. In addition, the friction may also cause fracture in the oxide layer on the surface of the bump BMP.

In addition, when the oxide layer and the second conductive layer CL2 are fractured, the first conductive layer CL1 and the bump BMP may come in contact with each other. When the first conductive layer CL1 and the bump BMP contact each other, the friction may cause a portion of the first conductive layer CL1 in the bump BMP direction and a portion of the bump BMP in the direction of the first conductive layer CL1 to be melted.

The melted portions may become the mixed conductive layer CML including the first conductive layer material and the bump material between the first conductive layer CL1 and the bump BMP.

In addition, the oxide of the bump material and the second conductive layer material may be present as fragments in the mixed conductive layer CML since the melting temperature of the oxide of the bump material and the second conductive layer material may be higher than the melting temperature of the first conductive layer material and the bump material.

The region between the bumps BMP and the pads PD may be filled with the first non-conductive film NCF1. When the first non-conductive film NCF1 cools down, the first non-conductive film NCF1 may connect the substrate SUB to the first electronic device ED1. Therefore, the first non-conductive film NCF1 may improve the bonding force between the substrate SUB and the first electronic device ED1.

According to an embodiment, it is described that the heat, the pressure, and the ultrasonic waves are sequentially provided during ultrasonic bonding. However, the present disclosure is not limited thereto. For example, during the ultrasonic bonding, the heat, the pressure and the ultrasonic waves may be provided at the same (e.g., substantially the same) time.

Figure 12:
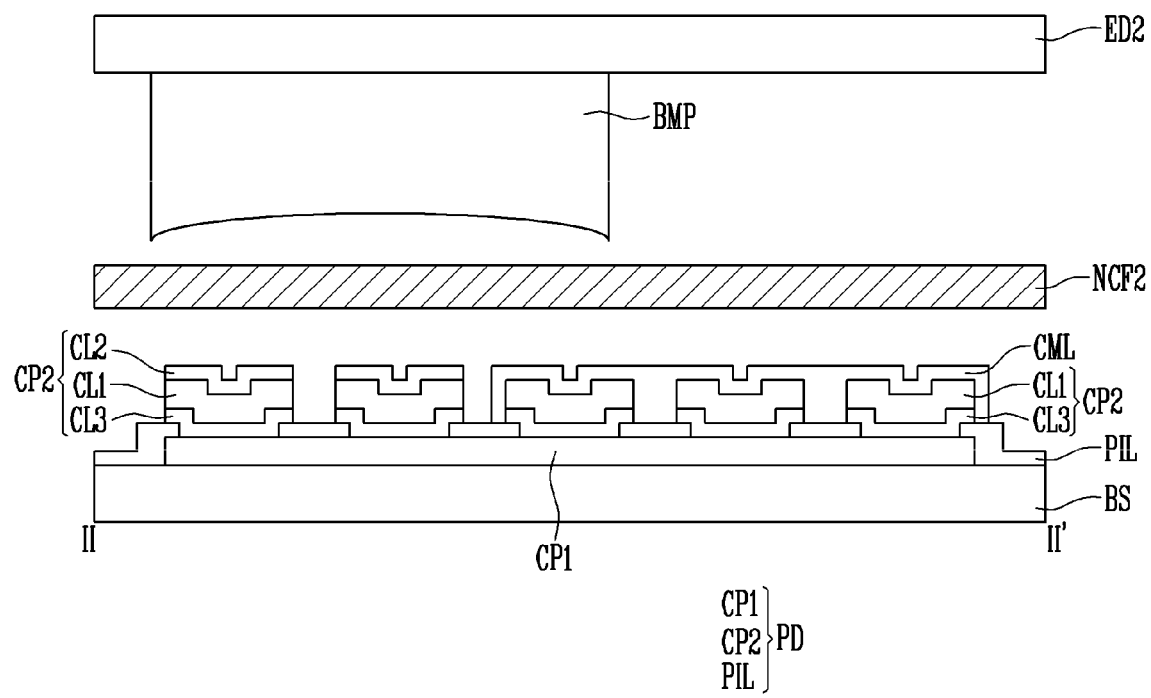

Referring to FIG. 12, after the substrate SUB and the first electronic device ED1 are electrically connected, a connection failure test may be carried out on the substrate SUB and the first electronic device ED1. When a connection failure is detected, the first electronic device ED1 may be removed from the substrate SUB. When the first electronic device ED1 is removed, a portion of the mixed conductive layer CML on the first conductive layer CL1 may also be removed.

Figure 13:
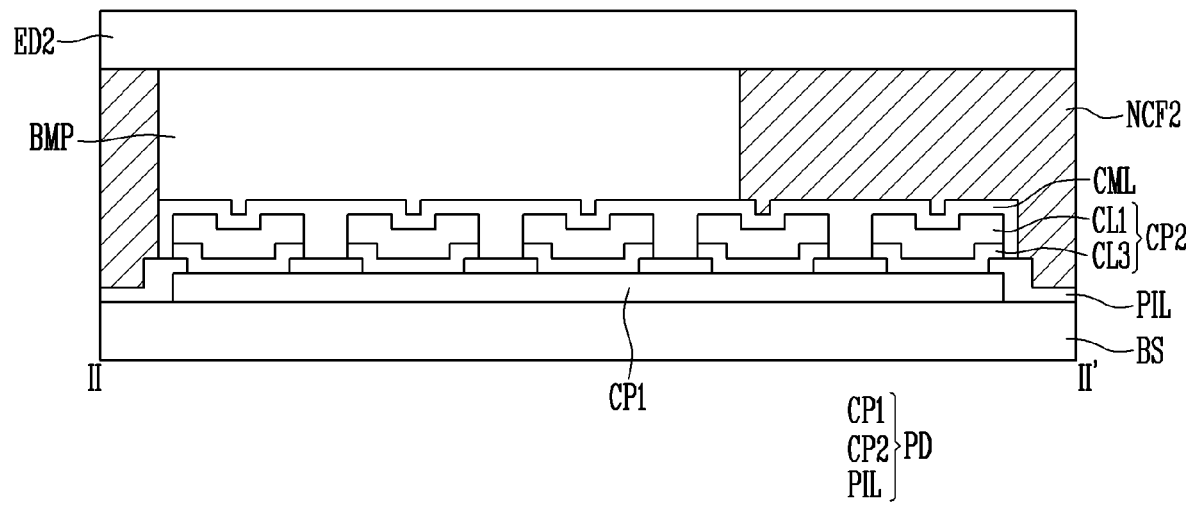

Referring to FIG. 13, after the first electronic device ED1 is removed, a second non-conductive film NCF2 and a second electronic device ED2 may be provided on the substrate SUB. The second non-conductive film NCF2 may include the same (e.g., substantially the same) material as the first non-conductive film NCF1. The second electronic device ED2 may be the same (e.g., substantially the same) electronic device as the first electronic device ED1. In other words, similarly to the first electronic device ED1, the bump BMP may be provided on one surface of the second electronic device ED2.

Subsequently, by applying heat, pressure and ultrasonic waves to the pad PD and the bump BMP of the second electronic device ED2, the substrate SUB and the second electronic device ED2 may be electrically connected to each other.

The bump BMP of the second electronic device ED2 may be connected to the second conductive patterns CP2 which are not connected to the bump BMP of the first electronic device ED1, among the second conductive patterns CP2.

The mixed conductive layer CML including the first conductive layer material and the bump material may be generated between the bump BMP of the second electronic device ED2 and the first conductive layer CL1 of the second conductive patterns CP2 which are not connected to the bump BMP of the first electronic device ED1. In addition, the second conductive layer material may be present as fragments in the mixed conductive layer CML. The generated mixed conductive layer CML may be connected to the mixed conductive layer CML formed when the first electronic device ED1 and the substrate SUB are connected to each other.

In addition, the bump BMP of the second electronic device ED2 may partially overlap with and be connected to at least a portion of the second conductive patterns CP2 connected to the bump BMP of the first electronic device ED1. In other words, the bump BMP of the second electronic device ED2 may partially overlap with at least the portion of the second conductive patterns CP2.

The region between the bumps BMP and the pads PD may be filled with the second non-conductive film NCF2 which is capable of flowing by heat. When the second non-conductive film NCF2 cools down, the second non-conductive film NCF2 may connect the substrate SUB to the second electronic device ED2. Therefore, the bonding force between the substrate SUB and the second electronic device ED2 may be improved by the second non-conductive film NCF2.

FIGS. 14-20 are plan views illustrating the shape of the pad PD shown in FIGS. 1-5.

Referring to FIGS. 1-5 and 14-20, the pad PD may include the first conductive pattern CP1 on the base substrate BS and the second conductive patterns CP2 separated from each other and provided on the pad insulating layer PIL provided on the first conductive pattern CP1 and including contact holes.

The first conductive pattern CP1 may have a square shape, but the present disclosure is not limited thereto. For example, the first conductive pattern CP1 may have various suitable shapes such as a circle, an ellipse, a semi-circle, and a semi-ellipse.

Figure 14:
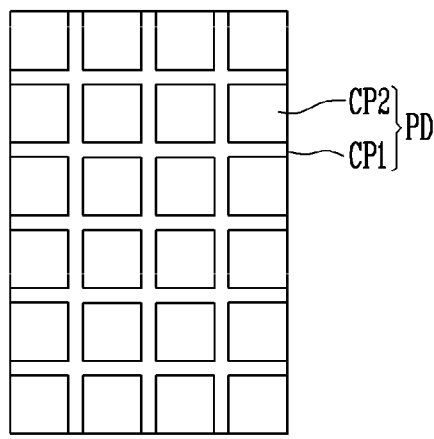
FIGS. 14-20 are plan views illustrating examples of the shape of a pad shown in FIGS. 1-5.
Figure 15:
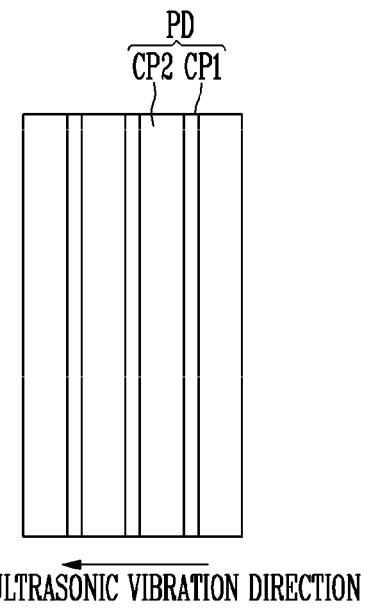
Figure 16:
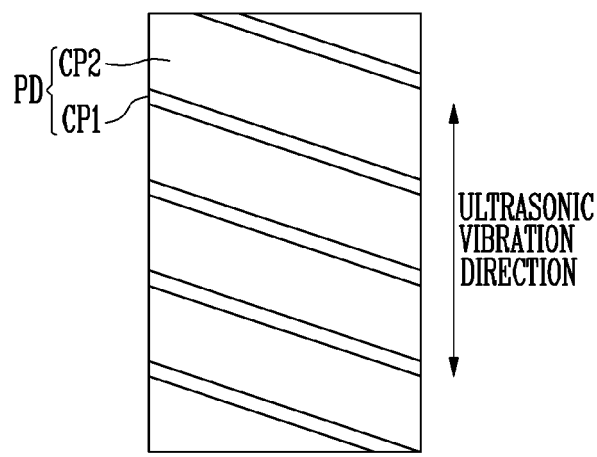
Figure 17:
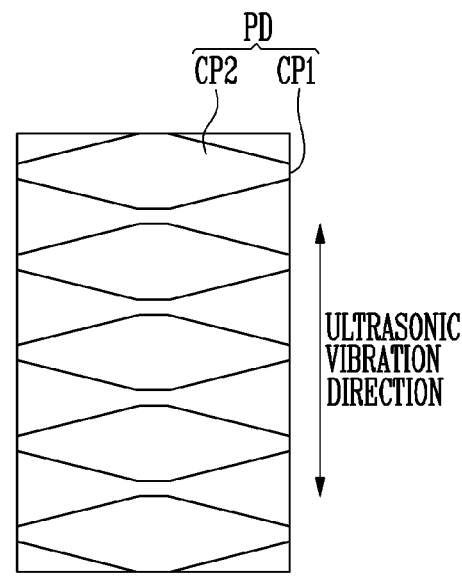
Figure 18:
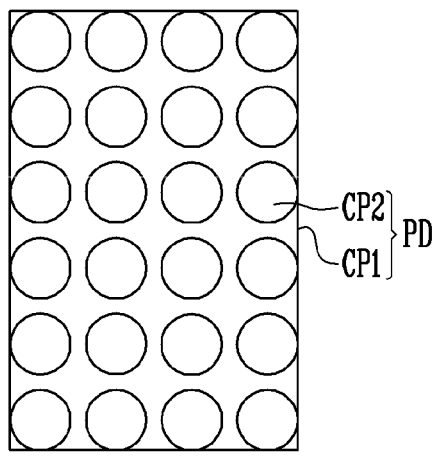
Figure 19:
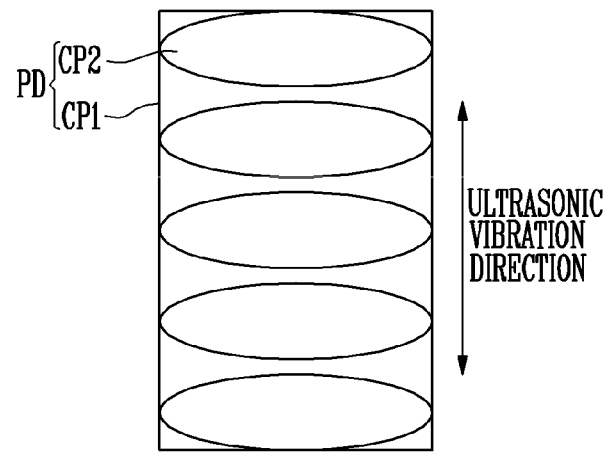
Figure 20:
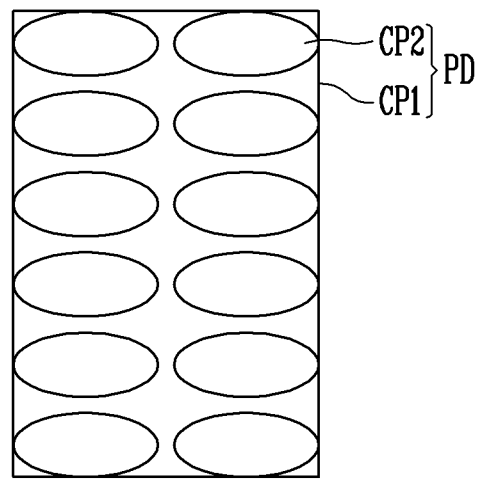

The second conductive patterns CP2 may have various suitable shapes. For example, as shown in FIGS. 3, 14 and 15, the second conductive patterns CP2 may have a rectangular shape. As shown in FIG. 16, the second conductive patterns CP2 may extend obliquely with respect to one side of the first conductive pattern CP1. As shown in 17, the second conductive patterns CP2 may have a shape of a rhombus or a hexagon. As shown in FIG. 18, the second conductive patterns CP2 may have a circular shape. As shown in FIGS. 19-20, each of the second conductive patterns CP2 may be formed in an elliptical shape whose major axis is in parallel (e.g., substantially in parallel) with the short side of the first conductive pattern CP1.

As shown in FIGS. 3, 15, 16, 17, and 19, the second conductive patterns CP2 may be arranged in a direction parallel (e.g., substantially in parallel) to a vibration direction of ultrasonic waves (e.g., an ultrasonic vibration direction). For example, adjacent ones of the second conductive patterns may be spaced apart from each other along a direction parallel (e.g., substantially parallel) to an ultrasonic vibration direction (e.g., a direction along which the ultrasonic vibration waves propagate). However, the present disclosure is not limited thereto. For example, the second conductive patterns CP2 may be arranged in a matrix format as shown in FIGS. 14, 18 and 20.

Figure 21:
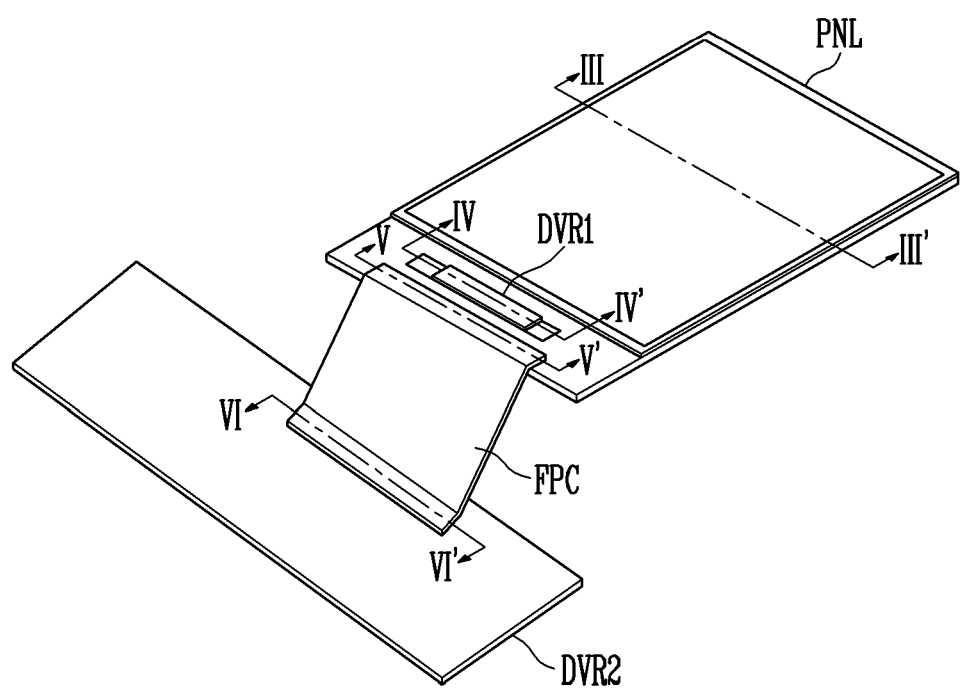
FIG. 21 is a perspective view illustrating a display device according to an embodiment of the present disclosure.
Figure 22:
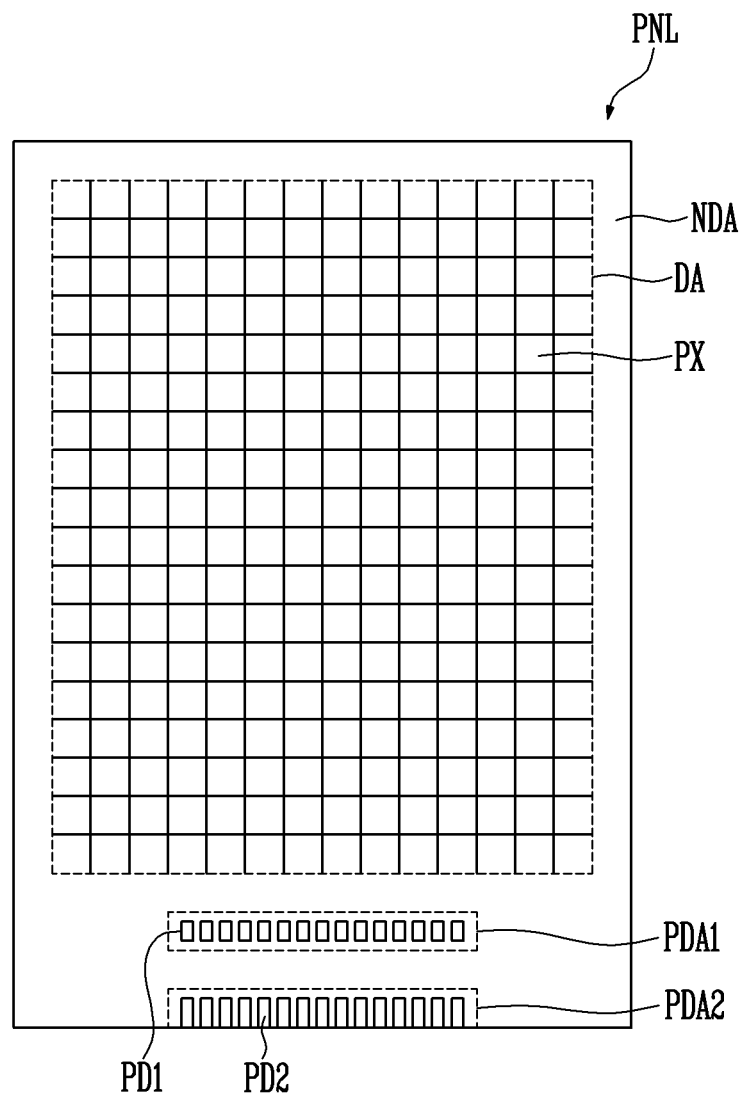
FIG. 22 is a plan view illustrating a display panel shown in FIG. 21.
Figure 23:
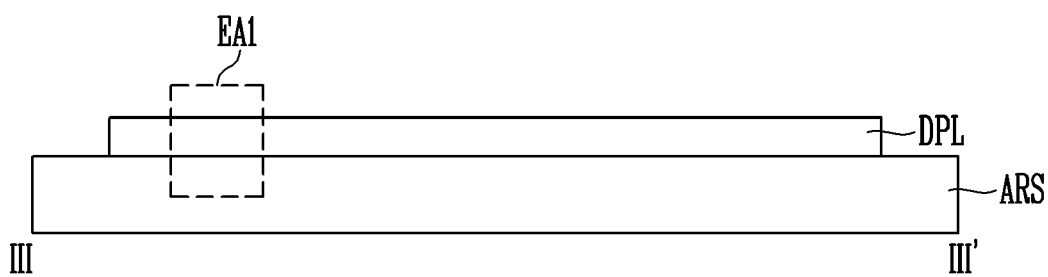
FIG. 23 is a cross-sectional diagram taken along the line III-III' of FIG. 21.
Figure 24:
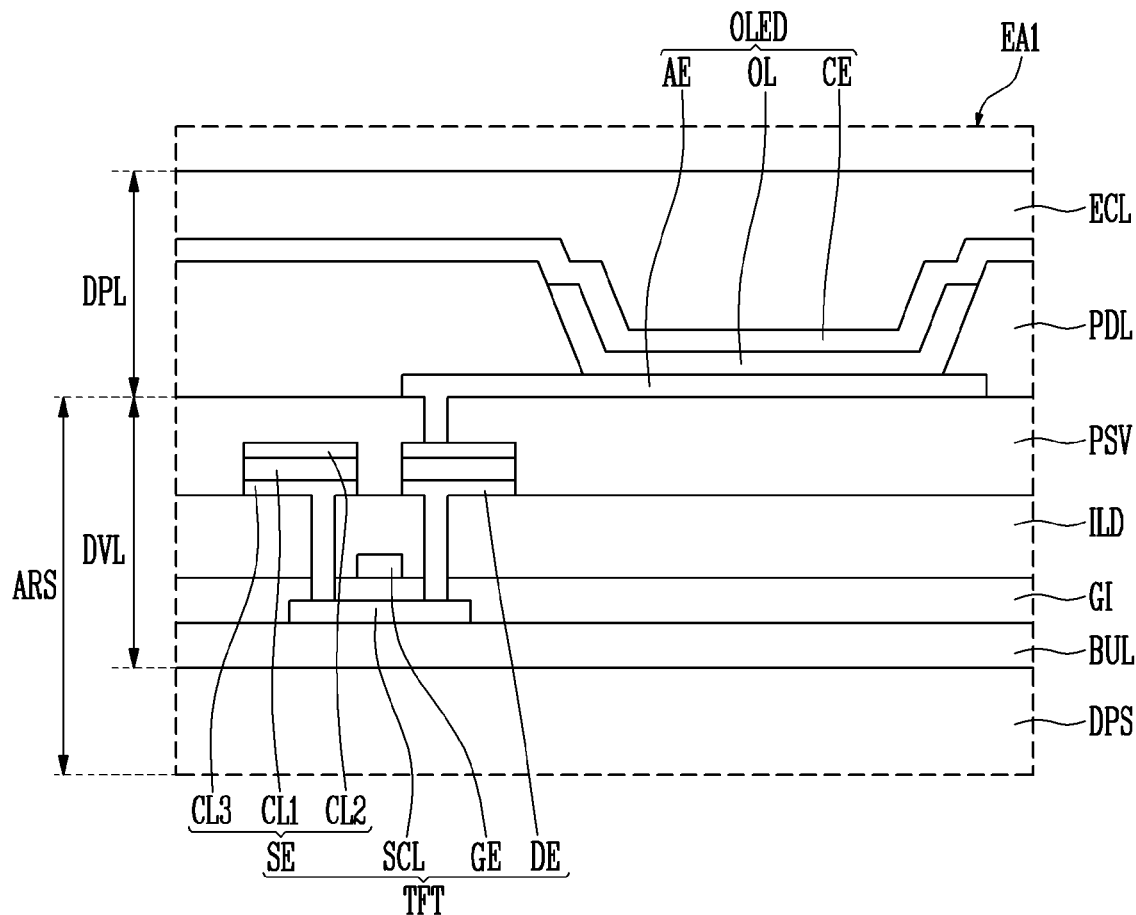
FIG. 24 is an enlarged view of an area EA1 shown in FIG. 23.

FIG. 21 is a perspective view illustrating a display device according to an embodiment. FIG. 22 is a plan view illustrating a display panel shown in FIG. 21. FIG. 23 is an enlarged view of an area EA1 of FIG. 23.

Referring to FIGS. 1-8 and 21-24, a display device may include a display panel PNL, a first driver DVR1 mounted on one side of the display panel PNL, a flexible printed circuit board FPC connected to one side of the display panel PNL, and a second driver DVR2 connected to the flexible printed circuit board FPC.

The display panel PNL may have various suitable shapes. For example, the display panel PNL may have a closed polygonal shape including straight sides. In addition, the display panel PNL may have a shape such as a circle and an ellipse including a curved surface. In addition, the display panel PNL may have a shape of a semi-circle or a semi-ellipse including curved and straight sides.

The display panel PNL may include a display area DA and a non-display area NDA provided around the display area DA.

A plurality of pixels PX may be provided in the display area DA. A plurality of gate lines and a plurality of data lines crossing the gate lines may be provided in the display area DA. Each of the pixels PX may include at least one thin film transistor TFT connected to one of the gate lines and one of the data lines and a display device OLED connected to the thin film transistor TFT.

The display device OLED may be one selected from a liquid crystal (LCD) element, an electrophoretic display (EPD) element, an electrowetting display (EWD) element, and an organic light emitting display (OLED) element. Hereinafter, for convenience of explanation, the OLED element is described as an example of the display device OLED.

The non-display area NDA may be arranged around the display area DA. For example, the non-display area NDA may be disposed outside the display area DA and surround the display area DA. In addition, a first pad unit PDA1 including a plurality of first pads PD1 connected to the first driver DVR1 and a second pad unit PDA2 including a plurality of second pads PD2 connected to the flexible printed circuit board FPC may be provided on a portion of the non-display area NDA.

Hereinafter, the structure of the display panel PNL is described according to a stacking order.

In the display area DA, the display panel PNL may include an array substrate ARS and a display layer DPL provided on the array substrate ARS.

The array substrate ARS may include an insulating substrate DPS, and a driving layer DVL provided on the insulating substrate DPS.

The insulating substrate DPS may include a transparent insulating material which transmits light. The insulating substrate DPS may be a rigid substrate. For example, the insulating substrate DPS may be one selected from a glass substrate, a quartz substrate, a glass ceramic substrate and a crystalline glass substrate.

In addition, the insulating substrate DPS may be a flexible substrate. The insulating substrate DPS may be one selected from a film substrate including a polymeric organic material and a plastic substrate. For example, the insulating substrate DPS may include one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the insulating substrate DPS may be variously changed and include fiber reinforced plastic (FRP).

In the pixel PX, the driving layer DVL may include at least one thin film transistor TFT.

The thin film transistor TFT may include a semiconductor layer SCL, a gate electrode GE insulated from the semiconductor layer SCL, and a source electrode SE and a drain electrode DE connected to the semiconductor layer SCL.

The semiconductor layer SCL may be disposed on the insulating substrate DPS. The semiconductor layer SCL may include one selected from amorphous silicon (a-Si), polycrystalline silicon (p-Si), oxide semiconductor, and organic semiconductor. The oxide semiconductor may include Zn, In, Ga, Sn and/or a mixture thereof. For example, the oxide semiconductor may include Indium gallium zinc oxide (IGZO).

In the semiconductor layer SCL, regions where the source electrode SE and the drain electrode DE are connected to each other may be a source region and a drain region into which impurities are doped or implanted. In addition, a region between the source region and the drain region may be a channel region.

When the semiconductor layer SCL includes an oxide semiconductor, a light shielding layer may be disposed on or under the semiconductor layer SCL so as to block light from coming in the semiconductor layer SCL.

A buffer layer BUL may be arranged between the insulating substrate DPS and the semiconductor layer SCL. The buffer layer BUL may prevent diffusion and infiltration of impurities into the semiconductor layer SCL from the insulating substrate DPS (or may reduce such diffusion and infiltration of impurities), so that deterioration of electric characteristic of the thin film transistor TFT may be prevented (or reduced).

The buffer layer BUL may include at least one selected from an organic insulating layer and an inorganic insulating layer. The organic insulating layer may include an organic insulating material transmitting light. For example, the organic insulating layer may include at least one selected from polyacrylates resin, epoxy resin, phenolic resin, polyamides resin, polyimides rein, unsaturated polyesters resin, poly-phenylene ethers resin, poly-phenylene sulfides resin, and benzocyclobutenes resin. The inorganic insulating layer may include at least one selected from silicon oxide SiOx (where $1 \leq x \leq 2$) and silicon nitride SiNx ($1 \leq x \leq 1.33$). For example, the inorganic insulating layer may include a first layer including silicon oxide and a second layer disposed on the first layer and including silicon nitride.

In addition, the buffer layer BUL may prevent (or reduce) moisture and oxygen intrusion into the display device OLED from the outside. The buffer layer BUL may planarize the surface of the insulating substrate DPS.

A gate insulating layer GI covering the semiconductor layer SCL may be arranged on the insulating substrate DPS and the semiconductor layer SCL. The gate insulating layer GI may insulate the semiconductor layer SCL and the gate electrode GE. Similarly to the buffer layer BUL, the gate insulating layer GI may include at least one selected from an organic insulating layer and an inorganic insulating layer.

The gate electrode GE may be arranged on the gate insulating layer GI. The gate electrode GE may partially overlap with the semiconductor layer SCL. In addition, the gate electrode GE may include a conductive material.

An interlayer insulating layer ILD may be arranged on the gate insulating layer GI and the gate electrode GE. In other words, the interlayer insulating layer ILD may cover the gate electrode GE. Similarly to the gate insulating layer GI, the interlayer insulating layer ILD may include at least one selected from an organic insulating layer and an inorganic insulating layer. In addition, the interlayer insulating layer ILD may be partially removed to expose the source region and the drain region of the semiconductor layer SCL.

The source electrode SE and the drain electrode DE may be arranged on the interlayer insulating layer ILD. The source electrode SE and the drain electrode DE may be insulated from the gate electrode GE by the interlayer insulating layer ILD. In addition, the source electrode SE and the drain electrode DE may contact the source region and the drain region.

The source electrode SE and the drain electrode DE may include the first conductive layer CL1 provided on the interlayer insulating layer ILD, the second conductive layer CL2 provided on the first conductive layer CL1, and the third conductive layer CL3 provided between the first conductive layer CL1 and the interlayer insulating layer ILD.

The first conductive layer CL1 may have conductivity and include a flexible material. For example, the first conductive layer CL1 may include at least one selected from gold (Au), aluminum (Al), copper (Cu), tin (Sn), and molybdenum (Mo).

The second conductive layer CL2 may have conductivity and include a material more rigid than the first conductive layer material. In addition, the melting temperature of the second conductive layer material may be higher than the melting temperature of the first conductive layer material. For example, the second conductive layer CL2 may include at least one selected from titanium (Ti), molybdenum (Mo), tin (Sn), nickel (Ni), and a conductive oxide.

The third conductive layer CL3 may include a material more rigid than the first conductive layer material. For example, the third conductive layer CL3 may include at least one selected from titanium (Ti), molybdenum (Mo), tin (Sn), nickel (Ni), and a conductive oxide. In addition, the third conductive layer CL3 may include the same material (e.g., substantially the same) as the second conductive layer CL2.

According to an embodiment, an example in which the thin film transistor TFT has a top gate structure is described. However, the present disclosure is not limited thereto. For example, the thin film transistor TFT may have a bottom gate structure.

The driving layer DVL may further include a protective layer PSV covering the thin film transistor TFT. The protective layer PSV may partially expose the drain electrode DE.

The protective layer PSV may include at least one layer. For example, the protective layer PSV may include at least one selected from an inorganic protective layer and an organic protective layer. For example, the protective layer PSV may include the inorganic protective layer covering the thin film transistor TFT and the organic protective layer provided on the inorganic protective layer.

The display layer DPL may be provided on the protective layer PSV. In the pixel PX, the display layer DPL may include the display device OLED connected to the thin film transistor TFT.

The display device OLED may include a first electrode AE connected to the drain electrode DE, an organic layer OL disposed on the first electrode AE, and a second electrode CE provided on the organic layer OL.

One selected from the first electrode AE and the second electrode CE may be an anode electrode and the other may be a cathode electrode. For example, the first electrode AE may be an anode electrode and the second electrode CE may be a cathode electrode.

In addition, at least one selected from the first electrode AE and the second electrode CE may be a transmissive electrode. For example, when the display device OLED is a bottom emission type (or kind) of organic light emitting element, the first electrode AE may be a transmissive electrode and the second electrode CE may be a reflective electrode. When the display device OLED is a top emission type (or kind) of organic light emitting element, the first electrode AE may be a reflective electrode and the second electrode CE may be a transmissive electrode. When the display device OLED is a dual emission type (or kind) of organic light emitting element, both the first electrode AE and the second electrode CE may be transmissive electrodes. Hereinafter, for example, the first electrode AE may be an anode electrode and the display device OLED may be a top emission type (or kind) of display device.

The first electrode AE may be disposed on the protective layer PSV. The first electrode AE may include a reflective layer reflecting light and a transparent conductive layer disposed on or under the reflective layer. At least one selected from the reflective layer and the transparent conductive layer may contact the drain electrode DE.

The reflective layer may include a light reflecting material. For example, the reflective layer may include at least one selected from gold (Au), silver (Ag), chromium (Cr), molybdenum (Mo), platinum (Pt), nickel (Ni) and an alloy thereof.

The transparent conductive layer may include a transparent conductive oxide. For example, the transparent conductive layer may include at least one transparent conductive oxide, among indium tin oxide (ITO), indium zinc oxide (IZO), aluminum Zinc Oxide (AZO), gallium doped zinc oxide (GZO), zinc tin oxide (ZTO), gallium tin oxide (GTO), and fluorine doped tin oxide (FTO).

A pixel defining layer PDL may be arranged on the first electrode AE and the protective layer PSV. The pixel defining layer PDL may partially expose the first electrode AE. The pixel defining layer PDL may cover an edge of the first electrode AE and the protective layer PSV.

The pixel defining layer PDL may include an organic insulating material. For example, the pixel defining layer PDL may include polystyrene, polymethylmethacrylate (PMMA), polyacrylonitrile (PAN), polyamide (PA), polyimide (PI), polyarylether (PAE), heterocyclic polymer, parylene, epoxy resin, benzocyclobutene (BCB), siloxane based resin and silane based resin.

The organic layer OL may include a multilayer thin film structure including an emitting layer EML. For example, the organic layer OL may include a hole injection layer HIL for injecting holes, a hole transport layer HTL having excellent transportability and increasing recombination between holes and electrons by preventing (or reducing) movements of electrons which fail to be combined in the emitting layer, the emitting layer emitting light by recombination between the injected electrons and holes, an electron transport layer ETL smoothly transporting electrons to the emitting layer, and an electron injection layer EIL injecting electrons. The hole injection layer, the hole transport layer, the electron transport layer and the hole injection layer may extend to neighboring pixels PX and be shared by the pixels PX. The emitting layer may generate light of one selected from red, green, blue and white. However, the present disclosure is not limited thereto. For example, the color of the light emitted from the emitting layer of the organic layer OL may be one selected from magenta, cyan, and yellow.

The second electrode CE may be arranged on the organic layer OL. The second electrode CE may be a transflective layer. For example, the second electrode CE may be a thin metal layer which is thick (or thin) enough to transmit light. The second electrode CE may transmit a portion of the light generated from the organic layer OL and reflect the remaining portion of the light generated from (or by) the organic layer OL. Light reflected from the second electrode CE may be reflected from the reflective layer of the first electrode AE and pass through the second electrode CE by constructive interference.

The second electrode CE may include a material having a lower work function than the transparent conductive layer of the first electrode AE. For example, the second electrode CE may include at least one selected from molybdenum (Mo), tungsten (W), silver (Ag), magnesium (Mg), gold (Au), platinum (Pt), palladium (Pd), gold (Au), nickel (Ni), neodymium (Nd), iridium (Ir), chromium (Cr), nickel (Ni), calcium (Ca) and an alloy thereof.

A sealing layer ECL may be arranged on the second electrode CE. The sealing layer ECL may isolate the display device OLED from the external environment. For example, the sealing layer ECL may prevent (or reduce) intrusion of external moisture and oxygen into the display device OLED. The sealing layer ECL may be a thin-film sealing layer including a plurality of inorganic layers and a plurality of organic layers arranged on the second electrode CE. For example, the sealing layer ECL may have the inorganic layers and the organic layers stacked alternately with each other.

According to an embodiment, for example, the sealing layer ECL is formed to isolate the display device OLED from the external environment. However, the present disclosure is not limited thereto. Instead of the sealing layer ECL, a sealing substrate may be provided to isolate the display device OLED from the external environment. The sealing substrate may be bonded to the insulating substrate DPS by a sealant. When the sealing substrate is used to isolate (e.g., substantially isolate) the display device OLED from the external environment, the sealing layer ECL may be omitted.

In the non-display area NDA, the first pads PD1 and the second pads PD2 may be provided on the insulating substrate DPS. The first pads PD1 and the second pads PD2 may have the same (e.g., substantially the same) structure as the pad PD as shown in FIGS. 1-8. In other words, each of the first pads PD1 and the second pads PD2 may include the first conductive pattern CP1, the pad insulating layer PIL provided on the first conductive pattern CP1 and the plurality of second conductive patterns CP2 provided on the pad insulating layer PIL and separated from each other. The pad insulating layer PIL may include a plurality of contact holes exposing the first conductive pattern CP1. The second conductive patterns CP2 may be connected to the first conductive pattern CP1 through the contact holes.

The first conductive pattern CP1 and the gate electrode GE may include the same (e.g., substantially the same) material and be formed by the same (e.g., substantially the same) process. The pad insulating layer PIL and the interlayer insulating layer ILD may include the same (e.g., substantially the same) material and be formed by the same (e.g., substantially the same) process. The second conductive patterns CP2 may have the same (e.g., substantially the same) structure as the source electrode SE and the drain electrode DE.

Each of the first pads PD1 and each of the second pads PD2 may be connected to the gate lines and the data lines, respectively. For example, each of the first pads PD1 may be connected to the gate lines, and each of the second pads PD2 may be connected to the data lines.

The first pads PD1 or the second pads PD2, for example, the first pads PD1 may be connected to the first driver DVR1. In addition, the other pads, e.g., the second pads PD2 may be connected to the flexible printed circuit board FPC.

The first driver DVR1 may be the electronic device ED shown in FIGS. 6-7. For example, the first driver DVR1 may be a semiconductor substrate, bumps opposing the first pads PD1 may be provided on one surface of the first driver DVR1.

The first driver DVR1 may supply one selected from a scan signal and a data signal to the display panel PNL. For example, the first driver DVR1 may supply the scan signal to the display panel PNL.

One end of the flexible printed circuit board FPC may be connected to the second pads PD2. In addition, the other end of the flexible printed circuit board FPC may be connected to the second driver DVR2. Bumps opposing the second pads PD2 may be provided on one end of the flexible printed circuit board FPC. Bumps or conductive pads connected to the second driver DVR2 may be provided on the other end of the flexible printed circuit board FPC.

The second driver DVR2 may be connected to the flexible printed circuit board FPC. The second driver DVR2 may supply the data signal to the display panel PNL through the flexible printed circuit board FPC and the second pads PD2.

The second driver DVR2 may be composed of a printed circuit board. When the second driver DVR2 supplies the data signal, the second driver DVR2 may be composed of a printed circuit board mounted with a data driving chip.

Figure 25:
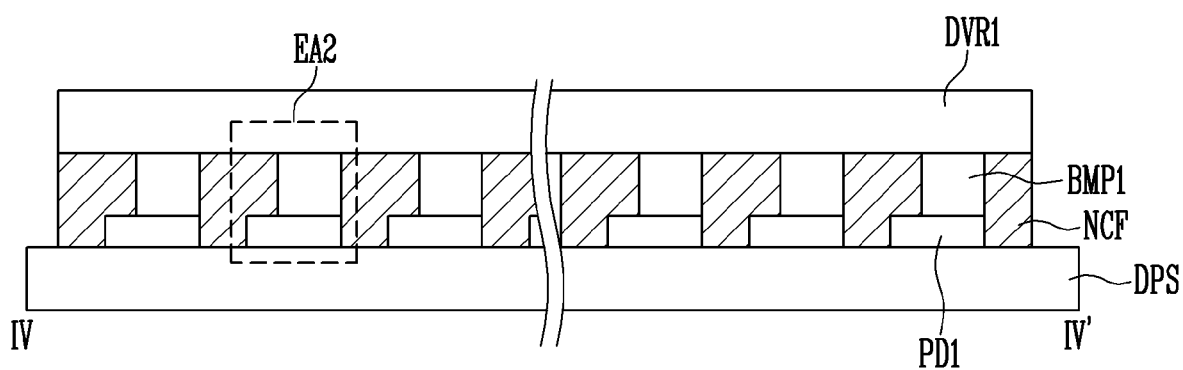
FIG. 25 is a cross-sectional diagram taken along the line IV-IV' of FIG. 21.
Figure 26:
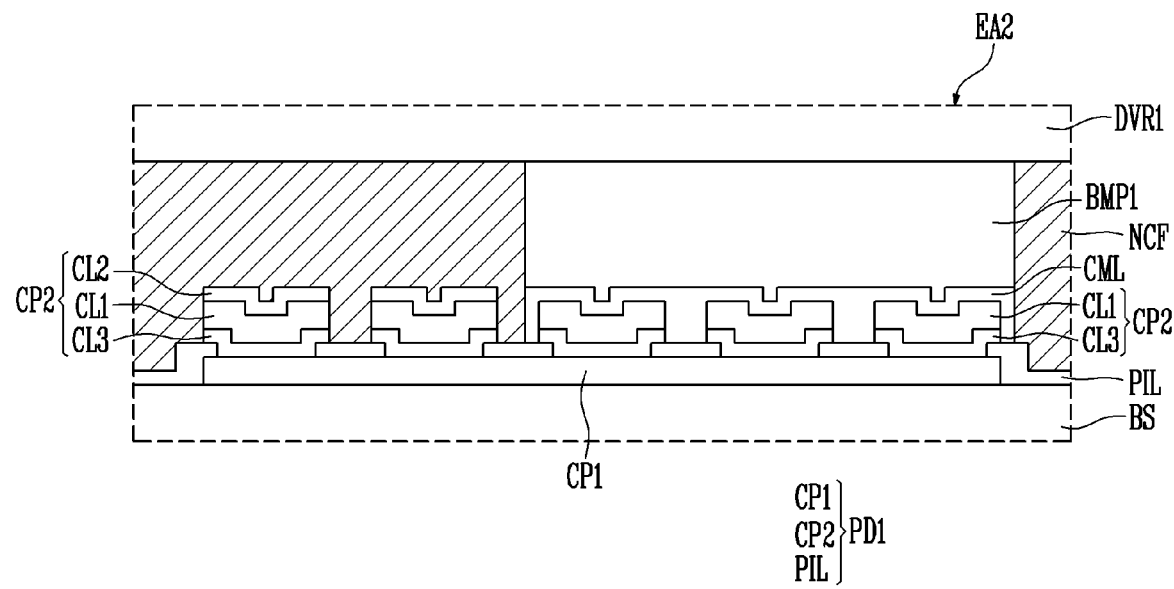
FIG. 26 is an enlarged view of an area EA2 shown in FIG. 25.

FIG. 25 is a cross-sectional diagram taken along the line IV-IV' of FIG. 21. FIG. 26 is an enlarged view of the area EA2 of FIG. 25.

Referring to FIGS. 1-8 and FIGS. 21-25, the first pads PD1 of the display panel PNL may be connected to the first driver DVR1. First bumps BMP1 connected to the first pads PD1 may be provided on one surface of the first driver DVR1. The first bumps BMP1 may have the same (e.g., substantially the same) structure as the bump BMP shown in FIGS. 6-7.

The first pads PD1 may have a similar structure to the pads PD shown in FIGS. 1-8. In other words, each of the first pads PD1 may include the first conductive pattern CP1, the pad insulating layer PIL provided on the first conductive pattern CP1, and the plurality of second conductive patterns CP2 provided on the pad insulating layer PIL and separated from each other. The pad insulating layer PIL may have a plurality of contact holes exposing the first conductive pattern CP1. The second conductive patterns CP2 may be connected to the first conductive pattern CP1 through the contact holes.

The first conductive pattern CP1 and the gate electrode GE of the thin film transistor TFT may include the same (e.g., substantially the same) material and be formed by the same (e.g., substantially the same) process. The pad insulating layer PIL and the interlayer insulating layer ILD of the array substrate ARS may include the same (e.g., substantially the same) material and be formed by the same (e.g., substantially the same) process.

Some of the second conductive patterns CP2 of each of the first pads PD1 may be connected to each of the first bump BMP1 and the remaining second conductive patterns CP2 may not be connected to the first bump BMP1.

The second conductive patterns CP2 which are not connected to the first bump BMP1 may include the first conductive layer CL1, the second conductive layer CL2 provided on the first conductive layer CL1, and the third conductive layer CL3 provided between the first conductive layer CL1 and the first conductive pattern CP1 and connected to the first conductive pattern CP1.

The second conductive patterns CP2 connected to the first bump BMP1 may be provided on the first conductive layer CL1 and between the first conductive layer CL1 and the first conductive pattern CP1, and include the third conductive layer CL3 connected to the first conductive pattern CP1. In other words, the second conductive patterns CP2 connected to the first bump BMP1 may not include the second conductive layer CL2. However, the mixed conductive layer CML may be disposed between the first bump BMP1 and the first conductive layer CL1 of the second conductive patterns CP2 connected to the first bump BMP1. In addition, the mixed conductive layer CML may fill the area between the second conductive patterns CP2.

The mixed conductive layer CML may include a mixture of the first conductive layer material and the bump material. In the mixed conductive layer CML, a mixing ratio between the first conductive layer material and the bump material may not be uniform. In other words, the mixing ratio between the first conductive layer material and the bump material may vary within the mixed conductive layer CML. In addition, the mixed conductive layer CML may include fragments of the second conductive layer material.

The region between the first bumps BMP1 and the first pads PD1 may be filled with the non-conductive film NCF, which may connect the display panel PNL to the first driver DVR1. Therefore, the bonding force between the display panel PNL and the first driver DVR1 may be improved by the non-conductive film NCF.

Figure 27:
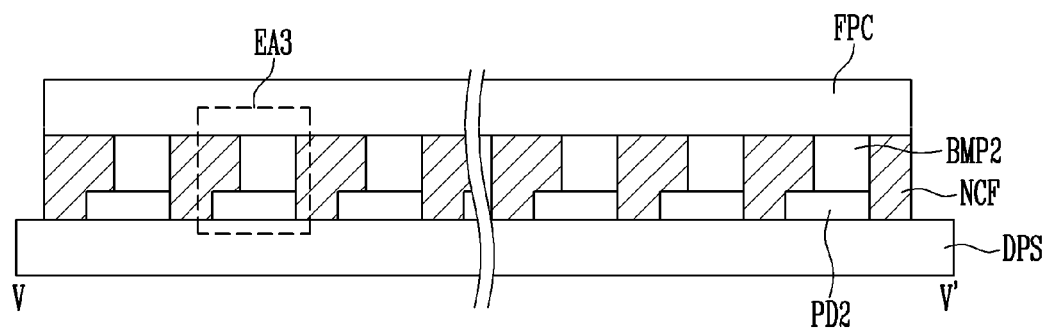
FIG. 27 is a cross-sectional diagram taken along the line V-V' of FIG. 21.
Figure 28:
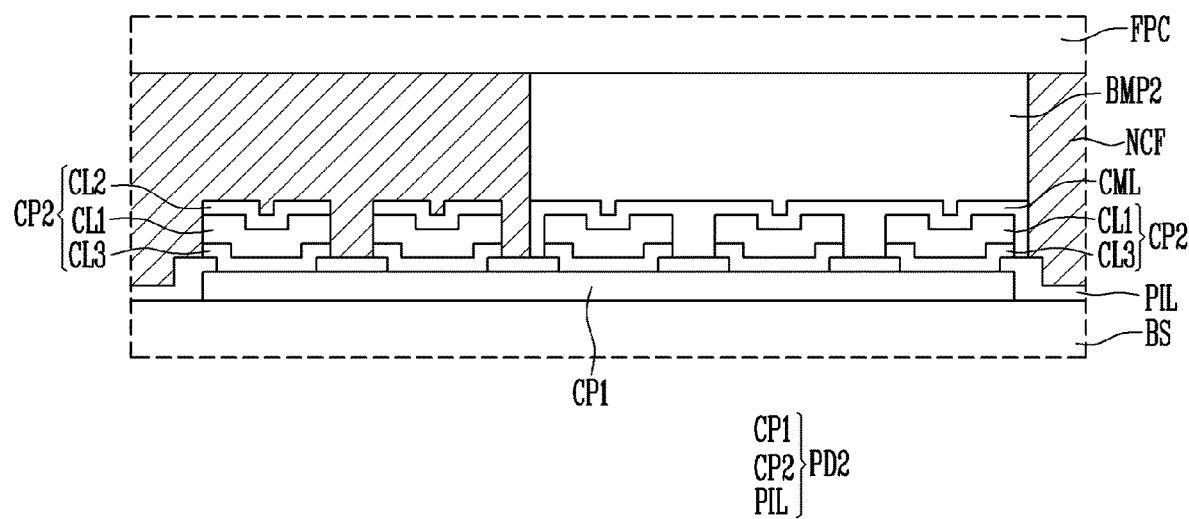
FIG. 28 is an enlarged view of an area EA3 shown in FIG. 27.

FIG. 27 is a cross-sectional diagram taken along the line V-V' of FIG. 21. FIG. 28 is an enlarged view of an area EA3 of FIG. 27.

Referring to FIGS. 1-8, 21-24, 27 and 28, the second pads PD2 of the display panel PNL may be connected to one end of the flexible printed circuit board FPC. Second bumps BMP2 may be provided on one surface of the flexible printed circuit board FPC so that each of the second bumps BMP2 may be connected to each of the second pads PD2. The second bumps BMP2 may have a similar structure to the bumps BMP shown in FIGS. 6-7.

The second pads PD2 may have the same (e.g., substantially the same) structure as the pads PD shown in FIGS. 1-8. In other words, each of the second pads PD2 may include the first conductive pattern CP1, the pad insulating layer PIL provided on the first conductive pattern CP1, and the plurality of second conductive patterns CP2 provided on the pad insulating layer PIL and separated from each other.

The first conductive pattern CP1 and the gate electrode GE of the thin film transistor TFT may include the same (e.g., substantially the same) material and be formed by the same (e.g., substantially the same) process. The pad insulating layer PIL and the interlayer insulating layer ILD of the array substrate ARS may include the same (e.g., substantially the same) material and be formed by the same (e.g., substantially the same) process.

Some of the second conductive patterns CP2 of each of the second pads PD2 may be connected to each of the second bumps BMP2, and the other second conductive patterns CP2 may not be connected to the second bump BMP2.

The second conductive patterns CP2 which are not connected to the second bump BMP2 may include the first conductive layer CL1, the second conductive layer CL2 provided on the first conductive layer CL1, and the third conductive layer CL3 provided between the first conductive layer CL1 and the first conductive pattern CP1 and connected to the first conductive pattern CP1.

Each of the second conductive patterns CP2 connected to the second bump BMP2 may include the first conductive layer CL1 and the third conductive layer CL3 provided between the first conductive layer CL1 and the first conductive pattern CP1 and connected to the first conductive pattern CP1. In other words, the second conductive patterns CP2 connected to the second bump BMP2 may not include the second conductive layer CL2. However, the mixed conductive layer CML may be disposed between the second bump BMP2 and the first conductive layer CL1 of the second conductive patterns CP2 connected to the second bump BMP2. In addition, the mixed conductive layer CML may fill the region between neighboring second conductive patterns CP2.

The mixed conductive layer CML may include a mixture of the first conductive layer material and the bump material. In the mixed conductive layer CML, a mixing ratio between the first conductive layer material and the bump material may not be uniform. In other words, the mixing ratio between the first conductive layer material and the bump material may vary within the mixed conductive layer CML. In addition, the mixed conductive layer CML may include fragments of the second conductive layer material.

The area between the second bumps BMP2 and the second pads PD2 may be filled with the non-conductive film NCF. The non-conductive film NCF may connect the display panel PNL to the flexible printed circuit board FPC. Therefore, the bonding force between the display panel PNL and the flexible printed circuit board FPC may be improved by the non-conductive film NCF.

Figure 29:
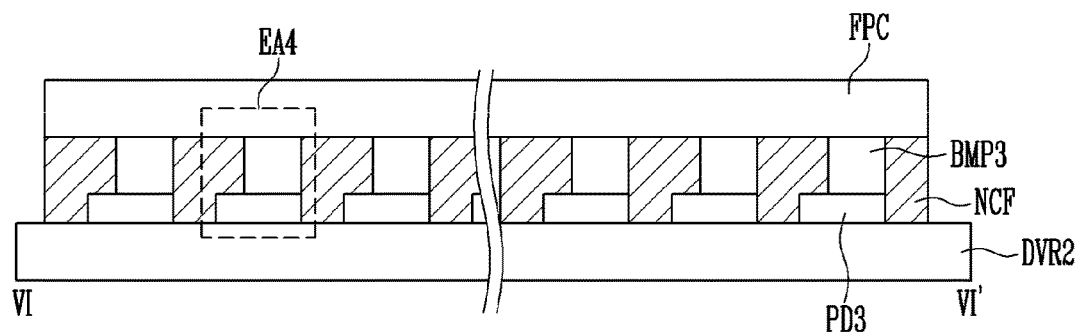
FIG. 29 is a cross-sectional diagram taken along the line VI-VI' of FIG. 21.
Figure 30:
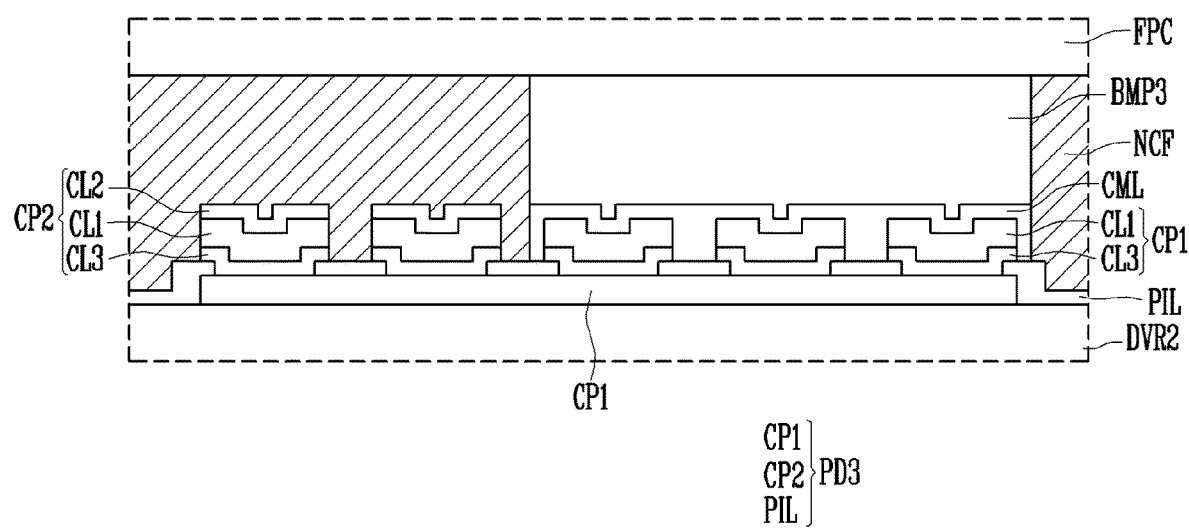
FIG. 30 is an enlarged view of an area EA4 shown in FIG. 29.

FIG. 29 is a cross-sectional diagram taken along the line VI-VI' of FIG. 21. FIG. 30 is an enlarged view of an area EA4 of FIG. 29.

Referring to FIGS. 1-8, 21-24, 29 and 30, the other end of the flexible printed circuit board FPC may be connected to the second driver DVR2.

Third pads PD3 may be provided on one surface of one selected from the flexible printed circuit board FPC and the second driver DVR2, for example, one surface of the second driver DVR2. In addition, third bumps BMP3 connected to the third pads PD3 may be provided on one surface of the other, e.g., one surface of the flexible printed circuit board FPC. The third bumps BMP3 may have the same (e.g., substantially the same) structure as the bumps BMP shown in FIGS. 6-7.

The third pads PD3 may have the same (e.g., substantially the same) structure as the pad PD shown in FIGS. 1-8. In other words, each of the third pads PD3 may include the first conductive pattern CP1, the pad insulating layer PIL provided on the first conductive pattern CP1, and the plurality of second conductive patterns CP2 provided on the pad insulating layer PIL and separated from each other.

Some of the second conductive patterns CP2 of each third pad PD3 may be connected to each third bump BMP3, and the other second conductive patterns CP2 may not be connected to the third bump BMP3.

The second conductive patterns CP2 which are not connected to the third bump BMP3 may include the first conductive layer CL1, the second conductive layer CL2 provided on the first conductive layer CL1, and the third conductive layer CL3 provided between the first conductive layer CL1 and the first conductive pattern CP1 and connected to the first conductive pattern CP1.

The second conductive patterns CP2 connected to the third bump BMP3 may include the first conductive layer CL1, and the third conductive layer CL3 provided between the first conductive layer CL1 and the first conductive pattern CP1 and connected to the first conductive pattern CP1. In other words, the second conductive patterns CP2 connected to the third bump BMP3 may not include the second conductive layer CL2. However, the mixed conductive layer CML may be provided between the third bump BMP3 and the first conductive layer CL1 of the second conductive patterns CP2 connected to the third bump BMP3. In addition, the mixed conductive layer CML may fill the region between the second conductive patterns CP2.

The mixed conductive layer CML may include a mixture of the first conductive layer material and the bump material. In the mixed conductive layer CML, a mixing ratio between the first conductive layer material and the bump material may not be uniform. In other words, the mixing ratio between the first conductive layer material and the bump material may vary within the mixed conductive layer CML. In addition, the mixed conductive layer CML may include fragments of the second conductive layer material.

The region between the third bumps BMP3 and the third pads PD3 may be filled with the non-conductive film NCF. The non-conductive film NCF may connect the second driver DVR2 to the flexible printed circuit board FPC. Therefore, the bonding force between the second driver DVR2 and the flexible printed circuit board FPC may be improved by the non-conductive film NCF.

According to an embodiment, pads on a substrate may be connected to input/output terminals of an electronic device, for example, bumps by ultrasonic bonding. Therefore, since an anisotropic conductive film is not used in the connection structure between the substrate and the electronic device, a short-circuit failure or an open-circuit failure may be prevented (or a likelihood or degree of such failure may be reduced).

Although example embodiments are disclosed herein, these embodiments should not be construed to be limiting. Those of ordinary skill in the art would recognize that various changes in form and details may be made without departing from the spirit and scope of the present disclosure. Furthermore, those skilled in the various arts will recognize that the present disclosure described herein will suggest solutions to other tasks and adaptations for other applications. It is the applicant's intention to cover by the claims herein, all such uses of the subject matter of the present disclosure, and those changes and modifications which could be made to the example embodiments of the present disclosure herein chosen for the purpose of disclosure, all without departing from the spirit and scope of the present disclosure. Thus, the example embodiments of the present disclosure should be considered in all respects as illustrative and not restrictive, with the spirit and scope of the present disclosure as defined by the appended claims, and equivalents thereof.

What is claimed is:

1. A substrate, comprising:
a base substrate; and
a pad at one side of the base substrate, wherein the pad comprises:
a first conductive pattern on the base substrate;
an insulating layer comprising a plurality of contact holes exposing a portion of the first conductive pattern; and
second conductive patterns separately on the insulating layer and connected to the first conductive pattern through the plurality of contact holes,
wherein side surfaces of the second conductive patterns are exposed,
wherein the second conductive patterns comprise a first conductive layer and a second conductive layer stacked sequentially, and
wherein the second conductive layer comprises a material more rigid than a material included in the first conductive layer.

2. The substrate of claim 1, wherein a side surface of the first conductive layer is exposed.

3. The substrate of claim 2, wherein the first conductive layer comprises at least one selected from the group consisting of gold (Au), aluminum (Al), copper (Cu), tin (Sn), and molybdenum (Mo).

4. The substrate of claim 2, wherein the second conductive layer comprises at least one selected from the group consisting of titanium (Ti), molybdenum (Mo), tin (Sn), nickel (Ni), and a conductive oxide.

5. The substrate of claim 4, wherein the conductive oxide comprises at least one selected from the group consisting of indium tin oxide (ITO), indium zinc oxide (IZO), antimony zinc oxide (AZO), indium tin zinc oxide (ITZO), zinc oxide (ZnO), and tin oxide (SnO2).

6. The substrate of claim 2, further comprising a third conductive layer between the first conductive layer and the first conductive pattern.

7. The substrate of claim 6, wherein the third conductive layer comprises at least one selected from the group consisting of titanium (Ti), molybdenum (Mo), tin (Sn), nickel (Ni), and a conductive oxide.

8. The substrate of claim 6, wherein the third conductive layer comprises the same material as the second conductive layer.

9. An electronic device, comprising:
a substrate comprising a base substrate and a pad on the base substrate; and
an electronic device comprising a bump connected to the pad,
wherein the pad comprises:
a first conductive pattern on the base substrate;
an insulating layer comprising a plurality of contact holes exposing a portion of the first conductive pattern; and
second conductive patterns separately on the insulating layer and connected to the first conductive pattern through the plurality of contact holes,
wherein at least a portion of the second conductive patterns are connected to the bump,
wherein side surfaces of remaining second conductive patterns are exposed,
wherein the second conductive patterns connected to the bump comprise a first conductive layer,
wherein the remaining second conductive patterns comprise the first conductive layer and a second conductive layer on the first conductive layer, and
wherein the second conductive layer comprises a material more rigid than a first conductive layer material included in the first conductive layer.

10. The electronic device of claim 9,
wherein the electronic device further comprises a mixed conductive layer between the first conductive layer and the bump and comprising a mixture of the first conductive layer material and a bump material.

11. The electronic device of claim 10, wherein a side surface of the first conductive layer is exposed.

12. The electronic device of claim 11, wherein the first conductive layer comprises at least one selected from the group consisting of gold (Au), aluminum (Al), copper (Cu), tin (Sn), and molybdenum (Mo).

13. The electronic device of 11, wherein the second conductive layer comprises at least one selected from the group consisting of titanium (Ti), molybdenum (Mo), tin (Sn), nickel (Ni), and a conductive oxide.

14. The electronic device of 11, further comprising a third conductive layer between the first conductive layer and the first conductive pattern.

15. The electronic device of claim 14, wherein the third conductive layer comprises the same material as the second conductive layer.

16. The electronic device of 11, wherein the bump comprises at least one selected from the group consisting of gold (Au), aluminum (Al), copper (Cu), tin (Sn), and molybdenum (Mo).

17. The electronic device of 11, wherein the bump comprises the same material as the first conductive layer.

18. The electronic device of 11, wherein the mixed conductive layer comprises fragments comprising a second conductive layer material.

19. The electronic device of claim 9, further comprising a non-conductive film filling a region different from a region where the bump and the pad are connected.

20. The electronic device of claim 19, wherein the non-conductive film comprises a heat-flowable polymeric material.

21. An electronic device, comprising:
a substrate comprising a base substrate and a pad on the base substrate; and
an electronic device comprising a bump connected to the pad,
wherein the pad comprises:
a first conductive pattern on the base substrate;
an insulating layer comprising a plurality of contact holes exposing a portion of the first conductive pattern;
second conductive patterns separately on the insulating layer and comprising a first conductive layer connected to the first conductive pattern through the plurality of contact holes; and
a mixed conductive layer between the second conductive patterns and the bump,
wherein the mixed conductive layer comprises a mixture of a first conductive layer material and a bump material,
wherein a second conductive layer is between the first conductive layer and the first conductive pattern, and
wherein the second conductive layer comprises a material more rigid than the first conductive layer material.

22. The electronic device of claim 21, wherein the first conductive layer comprises at least one selected from the group consisting of gold (Au), aluminum (Al), copper (Cu), tin (Sn), and molybdenum (Mo).

23. The electronic device of claim 22, wherein the bump comprises at least one selected from the group consisting of gold (Au), aluminum (Al), copper (Cu), tin (Sn), and molybdenum (Mo).

24. The electronic device of claim 22, wherein the first conductive layer and the bump comprise the same material.

25. The electronic device of claim 21, wherein the mixed conductive layer comprises fragments comprising a second conductive layer material.

26. The electronic device of claim 21, wherein the second conductive layer comprises at least one selected from the group consisting of titanium (Ti), molybdenum (Mo), tin (Sn), nickel (Ni), and a conductive oxide.

27. The electronic device of claim 21, further comprising a non-conductive film filling a region different from a region where the bump and the pad are connected.

28. The electronic device of claim 27, wherein the non-conductive film comprises a heat-flowable polymeric material.

29. A display device, comprising:
a display panel comprising a display area and a non-display area, wherein the display panel comprises a first pad unit comprising a plurality of first pads and a second pad unit comprising a plurality of second pads in the non-display area;
a first driver comprising a plurality of first bumps connected to the first pads;
a flexible printed circuit board comprising a plurality of second bumps connected to the second pad units; and
a second driver connected to one end of the flexible printed circuit board,
wherein one selected from the flexible printed circuit board and the second driver comprises third bumps and the other comprises third pads connected to the third bumps, and
wherein each of the first pads, the second pads and the third pads comprises:
a first conductive pattern;
an insulating layer comprising a plurality of contact holes exposing a portion of the first conductive pattern; and
second conductive patterns separately on the insulating layer and connected to the first conductive pattern through the plurality of contact holes,
wherein at least a portion of the second conductive patterns are connected to one selected from the first to third bumps,
wherein side surfaces of remaining second conductive patterns are exposed,
wherein the second conductive patterns connected to one selected from the first to third bumps comprise a first conductive layer,
wherein the remaining second conductive patterns comprise the first conductive layer, and a second conductive layer on the first conductive layer, and
wherein the second conductive layer comprises a material more rigid than the first conductive layer.

30. The display device of claim 29,
wherein the display device further comprises a mixed conductive layer between the first conductive layer and the one selected from the first to third bumps and comprising a mixture of a first conductive layer material and a bump material.

31. The display device of claim 30, wherein a side surface of the first conductive layer is exposed.

32. The display device of claim 31, wherein the first conductive layer comprises at least one selected from the group consisting of gold (Au), aluminum (Al), copper (Cu), tin (Sn), and molybdenum (Mo).

33. The display device of claim 31, wherein the second conductive layer comprises at least one selected from the group consisting of titanium (Ti), molybdenum (Mo), tin (Sn), nickel (Ni), and a conductive oxide.

34. The display device of claim 31, further comprising a third conductive layer between the first conductive layer and the first conductive pattern.

35. The display device of claim 34, wherein the third conductive layer comprises the same material as the second conductive layer.

36. The display device of claim 31, wherein the first to third bumps comprise at least one selected from the group consisting of gold (Au), aluminum (Al), copper (Cu), tin (Sn), and molybdenum (Mo).

37. The display device of claim 31, wherein the mixed conductive layer comprises fragments comprising a second conductive layer material.

38. The display device of claim 29, further comprising a non-conductive film filling a region different from a region where the first to third bumps and the first to third pads are connected.

39. The display device of claim 38, wherein the non-conductive film comprises a heat-flowable polymeric material.

* * * * *